(12) United States Patent
Mitarashi

(10) Patent No.: US 6,946,892 B2
(45) Date of Patent: Sep. 20, 2005

(54) LEVEL TRANSFORMING CIRCUIT

(75) Inventor: Mutsumi Mitarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/749,586

(22) Filed: Jan. 2, 2004

(65) Prior Publication Data
US 2004/0140841 A1 Jul. 22, 2004

(30) Foreign Application Priority Data
Jan. 21, 2003 (JP) ........................................ 2003-012527

(51) Int. Cl.[7] .............................................. H03L 5/00
(52) U.S. Cl. ........................ 327/333; 327/112; 327/108; 376/81
(58) Field of Search ................................. 327/333, 108, 327/112, 389, 391; 326/68, 81, 83, 87

(56) References Cited

U.S. PATENT DOCUMENTS 5,880,617 A * 3/1999 Tanaka et al. .............. 327/333

6,696,858 B2 * 2/2004 Tokai ........................... 326/68

FOREIGN PATENT DOCUMENTS

| JP | 4-150411 | 5/1992 |
|----|----------|--------|
| JP | 6-216752 | 8/1994 |
| JP | 3258229  | 12/2001 |

* cited by examiner

Primary Examiner—Long Nguyen
(74) Attorney, Agent, or Firm—Wenderoth, Lind & Ponack, L.L.P.

(57) ABSTRACT

A level trasnforming circuit includes a first CMOS circuit, a first intermediate circuit, a second intermediate circuit, a second CMOS circuit, a seventh p-channel type MOS transistor, and an eighth p-channel type MOS transistor; wherein the first intermediate circuit and the second intermediate circuit form a latch circuit. To this latch circuit, writing of data is performed by way of the seventh p-channel type MOS transistor and the eighth p-channel type MOS transistor. Thus, the latch circuit is made up of a CMOS inverter. Therefore, fast operation can be obtained and drop of drivability can be restrained.

17 Claims, 12 Drawing Sheets

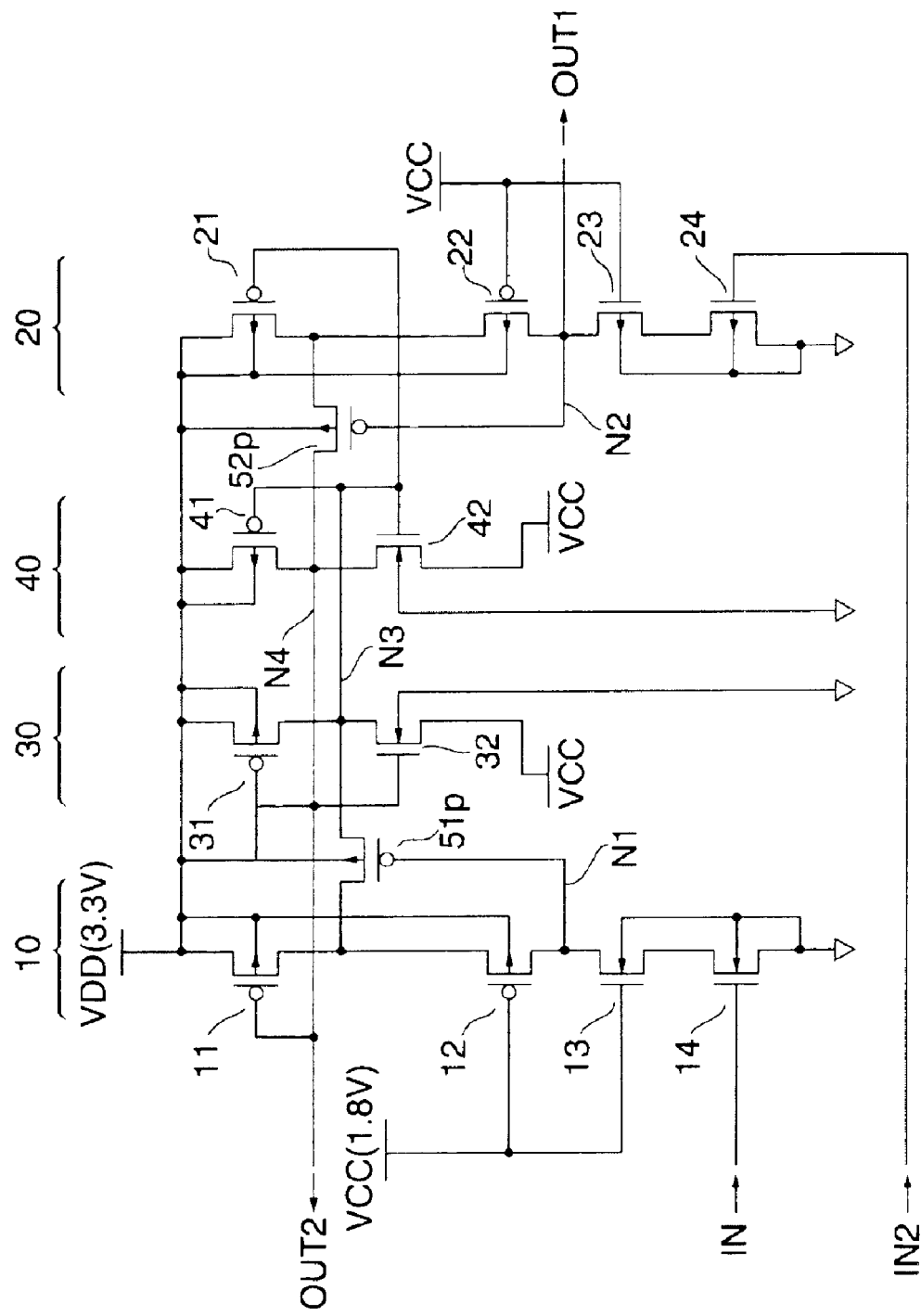

LEVEL TRANSFORMING CIRCUIT

BACKGROUND OF THE INVENTION

1. Field of the Invention

The present invention relates to a level transforming circuit serving as an interface of a digital circuit, wherein the level transforming circuit operates with different electricity source voltages.

2. Description of Related Art

The finer the structure of a MOS transistor becomes, the weaker the strength of a gate oxide film becomes. For example, a MOS transistor produced in a fine process of an extent of 0.35 μm is able to operate at an electricity source voltage of an extent of 3.3V. Further, a MOS transistor produced in a latest fine process of an extent of 0.18 μm is able to operate at an electricity source voltage of an extent of 1.8V. In the conventional art, when it is necessary to make an interface between a circuit of 0.18 μm fine process and a circuit of 0.35 μm fine process, a level transforming circuit in the interface required both MOS transistors of 1.8V and 3.3V.

(First Prior Art)

FIG. 10 is a circuit diagram showing a structure of a level transforming circuit of a first prior art disclosed in Japanese patent publication No. 4-150411. This level transforming circuit comprises, as shown in FIG. 10, a latch circuit 200, which operates with a high voltage electricity source VDD (3.3V). NMOS 211 and 212 are connected between node N11, N12 of this latch circuit 200 and the ground. A signal IN from a circuit which operates with a low voltage electricity source VCC (1.8) is impressed to the gate of NMOS 211. On the other hand, an inverse signal of the signal IN driven by an inverter 213, which operates with a low voltage electricity source VCC (1.8) as well, is impressed to the gate of NMOS 212. Provided that node N11, N12 of latch circuit 200 is respectively 3.3V, 0V; if the signal IN becomes 3.3V, NMOS 211 turns on and NMOS 212 turns off. As a result, node N11 becomes 0V and node N12 becomes 3.3V. Then, the input signal IN is transformed from 1.8V to 3.3V, and the signal latched in the latch circuit 200 is obtained from the node N12.

(Second Prior Art)

FIG. 11 is a circuit diagram showing a structure of a level transforming circuit of a second prior art disclosed in Japanese patent publication No. 6-216752. This level transforming circuit comprises MOS transistors having a dielectric strength of a gate oxide film which is lower than a high voltage (5V), so as to transform a level from a low voltage electricity source system to a high voltage electricity source system. As shown in FIG. 11, this level transforming circuit comprises a level transforming section comprising MOS transistors 300 to 313, and an output section comprising NOS transistors 314 to 317. The level transforming section has input the signal IN of a low voltage (VCC:3V) electricity source system, so as to output a signal for a transforming level to node N21, N22. The output section has input a control signal from the level transforming section mentioned above, so as to output an output signal OUT1 having an amplitude of 0V to 5V as a high voltage (VDD:5V) electricity source system, an output signal OUT2 having an amplitude of an intermediate electric potential to 5V, and output signal OUT3 having an amplitude of 0V to an intermediate electric potential.

Here, described is an occasion when an output enable signal OE and its inverse signal OEB are inputted with H level and L level respectively. If input signal IN becomes L level; PMOS 306, 307 turns on and NMOS 305, 312 turns off. As a result, node N23, N24 becomes H level, and NMOS 304 turns on. Then, source electric potential of NMOS 302 decreases, and a route of current comprised of NMOS 302, PMOS 301 is taken. On the other hand, node N25 is pulled down, and PMOS 308 turns on. When PMOS 308 turns on, node N21 becomes H level, and PMOS 309 turns on. Then, source electric potential of NMOS 310 is pulled up to the high voltage VDD. Moreover, when node N24 becomes H level, NMOS 311 is on, because the output enable signal EB is H level. Then, node N22 becomes H level, and output signal OUT3 becomes 0V. When node N21 becomes H level, PMOS 314 turns off, and output signal OUT2 becomes an intermediate electric potential. Output signal OUT1 becomes 0V, as NMOS 316 turns on, because output signal OUT3 is 0V.

On the other hand, if input signal IN becomes H level; NMOS 305, 312.turns on and PMOS 306, 307 turns off. Then, nodes N22, N23 are pulled down, and NMOS 317 turns off. Since NMOS 311 is on, node N24 is pulled down, and a route of current comprised of PMOS 309, NMOS 310 is taken. PMOS 314 turns on when node N21 is pulled down, and PMOS 300 turns on, so as to pull up node N25. Output signal OUT1 becomes 5V, output signal OUT2 becomes 5V, and output signal OUT3 becomes an intermediate electric potential.

(Third Prior Art)

FIG. 12 is a circuit diagram showing a structure of a level transforming circuit of a third prior art disclosed in Japanese patent No. 3258229. This level transforming circuit comprises MOS transistors with a dielectric strength of a gate oxide film which is lower than a high voltage (5V), so as to transform a level from a low voltage electricity source system to a high voltage electricity source system, similar to the second prior art. As shown in FIG. 12, this level transforming circuit comprises CMOS circuit 10, intermediate circuit 30, 40, and CMOS circuit 20.

CMOS circuit 10 comprises PMOS 11, 12 and NMOS 13, 14. PMOS 11, 12 are connected in series between the high voltage electricity source (VDD: 5V) and output node N1. NMOS 13, 14 are connected in series between the node N1 and the ground. The gate of PMOS 11 for pulling up is connected with node N4. On the other hand, the gate of NMOS 14 for pulling down is inputted with a signal IN which amplitude is between a low voltage (VCC: 3V) and the ground. On the other hand, each gate of PMOS 12 and NMOS 13 is impressed with the low voltage in common.

The intermediate circuit 30 comprises PMOS 31, 32. PMOS 31 is connected between the high voltage electricity source VDD and output node N3, and its gate is connected with node N4. On the other hand, PMOS 32 is connected between node N3 and the low voltage electricity source VCC, and its gate is connected with output node N1 of CMOS circuit 10.

The intermediate circuit 40 comprises PMOS 41, 42. PMOS 41 is connected between the high voltage electricity source VDD and output node N4,and its gate is connected with node N3. On the other hand, PMOS 32 is connected between node N4 and the low voltage electricity source VCC, and its gate is impressed with output signal OUT1.

CMOS circuit 20 comprises PMOS 21, 22 and NMOS 23, 24. PMOS 21, 22 are connected in series between the high voltage electricity source VDD and output node N2. NMOS 23, 24 are connected in series between the output node N2 and the ground. The gate of PMOS 21 for pulling up is connected with node N3. On the other hand, the gate of NMOS 24 for pulling down is inputted with an inverse signal of the input signal IN. Each gate of PMOS 22 and NMOS 23 is impressed with the low voltage in common.

Hereafter, the operation of this circuit is described.

When the input signal is the low voltage level VCC, NMOS 14 turns on. Thus, PMOS 32 turns on. As a result, PMOS 41, 21 turn on. On the other hand, NMOS 24 turns off by the inverse signal of the input signal. Thus, PMOS 42 turns off. Therefore, an output signal of the high voltage level VDD is output. In this state, direct current does not pass through the circuit because PMOS 11, 31, 42 and NMOS 24 are in an off state.

On the other hand, when the input signal changed from the low voltage level VCC to the ground level (0V level), NMOS 24 turns on. Thus, PMOS 42 turns on. As a result, PMOS 11, 31 turn on, and NMOS 14 turns off by the inverse signal of the input signal. Thus, PMOS 32 turns off. Therefore, an output signal of the ground level (0V level) is output. In this state, direct current does not pass through the circuit because PMOS 21, 41, 32 and NMOS 14 are in an off state.

However, the level transforming circuit of the conventional art have problems.

For example, as for the first prior art (FIG. 10), transistors having a gate oxide film strength higher than the voltage level VDD of high voltage electric source are used as some of the transistors, these transistors being each of two inverters comprising latch circuit 200 and NMOS 211, 212. Therefore, the gate oxide films of these transistors must be thick and their gate length must be long. In addition, in order to make MOS transistors capable of enduring high voltage, some portions of an integrated circuit on a semiconductor chip must be treated specially. Thus, there is a problem that a manufacturing process becomes complicated.

On the other hand, as for the second prior art (FIG. 11), a level transforming circuit is able to comprise only transistors having gate oxide film strength lower than the high voltage level VDD. However, the second prior art limits an amplitude of a gate voltage (node N21) of PMOS 314, by using the effect of turning off PMOS 309; so as to restrain the gate voltage under the strength of a gate oxide film less than the high voltage level VDD. Meanwhile, the gate of PMOS 309 is impressed with an electric potential VB. Therefore, the electric potential of the gate of PMOS 309 does not decrease less than VB+Vth, even if a logical value of node N21 is L level. Here, Vth is a threshold voltage of PMOS.

While PMOS 309 is turning off, the electric potential of node N1 gradually comes to VB+Vth. The level transforming circuit of the second prior art uses this motion, and therefore, could not operate rapidly.

Moreover, the gate voltage of PMOS 314 (electric potential of node N21) becomes VDD−(VB+Vth). Thus, if (VB+Vth) is higher than 0V, the gate voltage becomes low. Therefore, there is another problem that the ability to bear a load of the output section decreases. Moreover, the output signal OUT1 rises to 5V from 0V, when NMOS 317 turns off and PMOS 314 turns on. In this occasion, the source potential of PMOS 315 is pulled up rapidly. Therefore, the voltage Vgs between the gate and source of PMOS 315 becomes a voltage such that the current flowing in PMOS 315 is equal to the current flowing in PMOS 314. Thus, between the source and drain of PMOS 314, a voltage of VCC+Vgs is impressed. Similarly, output signal OUT1 drops to 0V from 5V, when PMOS 314 turns off and NMOS 317 turns on. In this occasion, the source potential of NMOS 316 is pulled down rapidly. Therefore, the voltage Vgs between gate and source of NMOS 316 becomes a voltage such that the current flowing in NMOS 316 is equal to the current flowing in NMOS 317. So, between the source and drain of NMOS 316, a voltage of VCC+Vgs is impressed. Therefore, a voltage exceeding the voltage preferred in a low voltage electricity source system is transiently impressed between the source and drain. Thus, an ability of the device is deteriorated by a hot carrier. As a result, a problem was caused in that the reliability of the device deteriorates.

Moreover, as for the third prior art (FIG. 12), a level transforming circuit is able to comprise only transistors having a gate oxide film strength lower than the high voltage level VDD. However, in the third prior art, as for CMOS circuit 10, a turning on resistance of PMOS 11, 12 is set higher than a turning on resistance of NMOS 13, 14. As for CMOS circuit 20, a turning on resistance of PMOS 21, 22 is set higher than a turning on resistance of NMOS 23, 24. As for intermediate circuit 30, a turning on resistance of PMOS 31 is set higher than a turning on resistance of PMOS 32. As for intermediate circuit 40, a turning on resistance of PMOS 41 is set higher than a turning on resistance of PMOS 42. Therefore, the third prior art has the following problem.

When input signal IN becomes the low voltage level VCC from the ground level, the electric potential of node N1 rises rapidly because the turning on resistance of NMOS 13, 14 is lower than the turning on resistance of PMOS 11, 12, and the voltage between source and drain of PMOS 12 becomes VCC+Vgs. Here, Vgs is the gate source voltage of PMOS 12, which flows current in PMOS 12 the same as the current flowing in PMOS 11. Thus, the voltage between the source and drain transiently becomes higher than VCC. Similarly, the voltage between the gate and source of PMOS 32 becomes VCC+Vgs. Here, Vgs is the gate source voltage of PMOS 32, which flows current in PMOS 32 the same as the current flowing in PMOS 31. Thus, the voltage between the gate and source transiently becomes higher than VCC. Therefore, voltage exceeding the voltage preferred in a low voltage electricity source system is transiently impressed between the source and drain. Moreover, voltage exceeding the voltage preferred in a low voltage electricity source system is transiently impressed between the gate and source. Thus, the ability of the device is deteriorated by a hot carrier. As a result, a problem was caused in that the reliability of the device deteriorates.

Moreover, with dropping of output node N3, output node N2 is pulled up by the turning on current of PMOS 21 flowing through PMOS 22. There is an occasion when a buffer to drive a succeeding output stage is provided to the level transforming circuit of FIG. 12. This buffer comprises two PMOS's (first PMOS and second PMOS) which are connected in series between the high voltage electricity source VDD and the low voltage electricity source VCC. The source of the first PMOS is connected with the high voltage electricity source VDD. The drain of the second PMOS is connected with the low voltage electricity source VCC. The gate of the first PMOS is connected with output node N3. The gate of the second PMOS is connected with output node N2. In this occasion, the first PMOS comes into an on state, while the second PMOS is still in an on state. Therefore, passing current flows from the high voltage electricity source VDD to the low voltage electricity source VCC. As a result, a problem is caused of increasing electricity consumption in vain.

Moreover, as described in Japanese patent 3258229, in the occasion when the output stage of the semiconductor integrated circuit is driven, each transistor of the output stage usually has a gate width of several hundred μm. Thus, as for a gate width of each transistor of a buffer driving this transistor of the output stage, if it is narrower than several hundred μm, current flowing through the output stage decreases. As a result, a problem is caused of deteriorating high mobility of the output stage.

The present invention is aimed at providing a novel and improved level transforming circuit, which is able to operate fast and to restrain drivability drop, so as to solve the problems contained in the level transforming circuit of the prior art mentioned above.

SUMMARY OF THE INVENTION

According to the first aspect of the present invention, provided is: a level transforming circuit comprising a first CMOS circuit (10), a first intermediate circuit (30), a second intermediate circuit (40), a second CMOS circuit (20), a seventh p-channel type MOS transistor (51p), and an eighth p-channel type MOS transistor (52p).

The first CMOS circuit (10) comprises first and second p-channel type MOS transistors (11,12) connected in series between a high voltage electricity source (VDD) and first output node (N1), and first and second n-channel type MOS transistors (13,14) connected in series between said first output node (N1) and the ground, wherein a gate of said first p-channel type MOS transistor (11) which functions as a pull up switch is impressed with a first signal, wherein the gate of second n-channel type MOS transistor (14) functioning as a pull down switch is impressed with an input signal (IN) having an amplitude between a low voltage electricity source (VCC) and the ground, and wherein gates of said second p-channel type MOS transistor (12) and said first n-channel type MOS transistor (13) are impressed with the low voltage electricity source (VCC) in common.

The first intermediate circuit (30) comprises third p-channel type MOS transistor (31) connected between the high voltage electricity source: (VDD) and second output node (N3), wherein its gate is impressed with said first signal, and it comprises third n-channel type MOS transistor (32) connected between said second output node (N3) and the low voltage electricity source (VCC), wherein its gate is impressed with said first signal.

The second intermediate circuit (40) comprises fourth p-channel type MOS transistor (41) connected between the high voltage electricity source (VDD) and a third output node (N4), wherein its gate is impressed with electric potential of second output node of said first intermediate circuit, and it comprises fourth n-channel type MOS transistor (42) connected between the third output node (N4) and the low voltage electricity source (VCC), wherein its gate is impressed with electric potential of second output node (N3), and it puts out said first signal from said third output node.

The second CMOS circuit 20 comprises fifth and sixth p-channel type MOS transistors (21,22) connected in series between the high voltage electricity source (VDD) and fourth output node (N2), and fifth and sixth n-channel type MOS transistors (23,24) connected in series between said fourth output node (N2) and the ground, wherein the gate of said fifth p-channel type MOS transistor (21) which functions as a pull up switch is impressed with a signal having an electric potential of second output node (N3) of the first intermediate circuit, and wherein the gate of said sixth n-channel type MOS transistor (24) functioning as a pull down switch is impressed with an inverse signal (IN2) of the input signal (IN), and wherein gates of said sixth p-channel type MOS transistor (22) and fifth n-channel type MOS transistor (23) are impressed with the low voltage electricity source (VCC) in common, and wherein a signal having an amplitude of said high voltage and ground voltage is output from said fourth output node (N2).

The seventh p-channel type MOS transistor (51p) is connected between a common node of first and second p-channel type MOS transistors (11,12) in series and second output node N3 of said first intermediate circuit, and its gate is impressed with an electric potential of said first output node (N1) of first CMOS circuit (10).

The eighth p-channel type MOS transistor (52p) is connected between a common node of fifth and sixth p-channel type MOS transistors (21,22) in series and third output node (N4) of said second intermediate circuit, and its gate is impressed with an electric potential of said fourth output node (N2) of second CMOS circuit (20).

According to the above configuration, electric potential exceeding the low voltage level is not statically impressed with the gate oxide film of each transistor. Therefore, a level transforming circuit is able to comprise only MOS transistors whose endurable strength of gate oxide film is lower than the high voltage electricity source level. In addition, the latch circuit comprises a CMOS invertor. On the other hand, the second prior art mentioned above (FIG. 2) employs an effect of turning off of the source follower transistor in order to limit amplitude of gate voltage. Therefore, the first aspect of present invention is able to operate faster than the second prior art and to restrain a drivability drop. Especially, as for an SOI device of a depletion type, whose dielectric strength between source and drain is low owing to its structure; the first aspect of present invention is extremely useful, because overvoltage is not impressed between the source and drain.

A level transforming circuit according to the second aspect of present invention uses the following structure.

Referring to the first aspect, the gate of the seventh p-channel type MOS transistor (51p) is impressed with an electric potential of said first output node (N1), and the gate of the eighth p-channel type MOS transistor (52p) is impressed with an electric potential of said fourth output node (N2). On the other hand, in this point, the gate of the seventh p-channel type MOS transistor (51p) is impressed with an electric potential of said low voltage, and the gate of the eighth p-channel type MOS transistor (52p) is impressed with the same electric potential of said low voltage.

According to the above structure, obtained is an effect that load to the gate oxide films of seventh p-channel type MOS transistor (51p) and eighth p-channel type MOS transistor (52p) further decreases.

Incidentally, in the level transforming circuit of the first or second aspect, the following adaptation is possible.

The turning on resistance of each MOS transistor is able to be set as follows.

(1) The turning on resistance of the first p-channel type MOS transistor in the first CMOS circuit is set higher than the turning on resistance of the second p-channel type MOS transistor, and the turning on resistance of the second n-channel type MOS transistor is set higher than the turning on resistance of the first n-channel type MOS transistor.

(2) The turning on resistance of the fifth p-channel type MOS transistor in the second CMOS circuit is set higher than the turning on resistance of the sixth p-channel type MOS transistor, and the turning on resistance of the sixth n-channel type MOS transistor is set higher than the turning on resistance of the fifth n-channel type MOS transistor.

(3) The turning on resistance of the third p-channel type MOS transistor in the first intermediate circuit is set higher than the turning on resistance of the seventh p-channel type MOS transistor.

(4) The turning on resistance of the fourth p-channel type MOS transistor in the second intermediate circuit is set higher than the turning on resistance of the eighth p-channel type MOS transistor.

According to the above structure, even in a transient state, a voltage exceeding a dielectric strength between the source and drain is not impressed between the source and drain of each MOS transistor. Therefore, a level transforming circuit is able to comprise only MOS transistors whose endurable dielectric strength between the source and drain is lower than the high voltage electricity source. Moreover, even in a transient state, a voltage exceeding the low voltage level is not impressed to the gate oxide film of each transistor mentioned above. Therefore, a level transforming circuit with higher reliability is able to comprise only MOS transistors whose endurable dielectric strength is lower than the high voltage electricity source.

Moreover, the substrate of third n-channel type MOS transistor (32) in the first intermediate circuit is connected with the source of the third n-channel type MOS transistor, and the substrate of fourth n-channel type MOS transistor (42) in the second intermediate circuit is connected with the source of the fourth n-channel type MOS transistor; and are isolated from the substrate of the other n-channel type MOS transistor.

Moreover, substrates of the seventh p-channel type MOS transistor (51p) and an eighth p-channel type MOS transistor (52p) are connected with each source or each drain; and are isolated from the substrate of the other n-channel type MOS transistor.

According to the above structure, third n-channel type MOS transistor (32) and fourth n-channel type MOS transistor (42) are formed in a p-well region isolated electrically from the substrate. Moreover, seventh and eighth p-channel type MOS transistors (51p, 52p) are isolated from the n-well of the other PMOS. Thus, obtained is an effect that a load to gate oxide films of third and fourth n-channel type MOS transistors (32, 42), and seventh and eighth p-channel type MOS transistors (51p, 52p), further decreases. Moreover, inverse bias voltage impressed to a pn junction formed between the drain and substrate of third and fourth n-channel type MOS transistors (32, 42) is able to decrease. Moreover, faster circuit operation is expected because a substrate bias effect of third and fourth n-channel type MOS transistors (32, 42) does not influence the operation of the circuit.

Moreover, each p-channel type MOS transistor and each n-channel type MOS transistor can be formed on an active region isolated by an insulating film. According to the above structure, an effect is obtained that passing current is small and a fast output circuit is realized.

Moreover, a first signal is a signal having an amplitude between the high voltage and the low voltage, and the first signal is output independently of the output signal. According to the above structure, operation can be fast and drop of load drivability can be restrained. Moreover, a range of adaptation of the level transforming circuit becomes wide.

The level transforming circuit according to third aspect of present invention is provided with seventh n-channel type MOS transistor (51n) and eighth n-channel type MOS transistor (52n), instead of seventh p-channel type MOS transistor (51p) and eighth p-channel type MOS transistor (52p). Gates of seventh n-channel type MOS transistor (51n) and eighth n-channel type MOS transistor (52n) are impressed with an electric potential of the high voltage.

According to the above structure, gates of seventh n-channel type MOS transistor (51n) and eighth n-channel type MOS transistor (52n) are impressed with the high voltage electricity source (VDD), so as to write data into the latch circuit comprising first CMOS circuit (10) and second CMOS circuit (20). Therefore, the turning on resistance becomes lower than what is obtained when the circuit comprises a p-channel type MOS transistor. Thus, an effect is obtained that an area of the elements decreases.

Incidentally, in the level transforming circuit of third aspect, the following adaptation is possible.

Turning on resistance of each MOS transistor is able to be set as follows.

(1) The turning on resistance of the first p-channel type MOS transistor in the first CMOS circuit is set higher than the turning on resistance of the second p-channel type MOS transistor, and the turning on resistance of the second n-channel type MOS transistor is set higher than the turning on resistance of the first n-channel type MOS transistor.

(2) The turning on resistance of the fifth p-channel type MOS transistor in the second CMOS circuit is set higher than the turning on resistance of the sixth p-channel type MOS transistor, and the turning on resistance of the sixth n-channel type MOS transistor is set higher than the turning on resistance of the fifth n-channel type MOS transistor.

(3) The turning on resistance of the third p-channel type MOS transistor in the first intermediate circuit is set higher than the turning on resistance of the seventh n-channel type MOS transistor.

(4) The turning on resistance of the fourth p-channel type MOS transistor in the second intermediate circuit is set higher than the turning on resistance of the eighth n-channel type MOS transistor.

According to the above structure, even in a transient state, a voltage exceeding a dielectric strength between the source and drain is not impressed between the source and drain of each MOS transistor. Therefore, a level transforming circuit is able to comprise only MOS transistors whose endurable dielectric strength between the source and drain is lower than the high voltage electricity source. Moreover, even in a transient state, a voltage exceeding the low voltage level is not impressed to the gate oxide film of each transistor mentioned above. Therefore, a level transforming circuit with higher reliability is able to comprise only MOS transistors whose endurable dielectric strength is lower than the high voltage electricity source.

Moreover, the substrate of third n-channel type MOS transistor (32) in the first intermediate circuit is connected with the source of third n-channel type MOS transistor, and the substrate of fourth n-channel type MOS transistor (42) in the second intermediate circuit is connected with the source of the fourth n-channel type MOS transistor; and are isolated from the substrate of the other n-channel type MOS transistor.

Moreover, substrates of seventh n-channel type MOS transistor (51n) and an eighth n-channel type MOS transistor (52n) are connected with each source or each drain; and are isolated from the substrate of the other n-channel type MOS transistor.

According to the above structure, third n-channel type MOS transistor (32) and fourth n-channel type MOS transistor (42) are formed in a p-well region isolated electrically from the substrate. Moreover, seventh and eighth n-channel type MOS transistors (51n, 52n) are isolated from the n-well of the other NMOS. Thus, obtained is an effect that a load to gate oxide films of third and fourth n-channel type MOS transistors (32, 42), and seventh and eighth n-channel type MOS transistors (51n, 52n), further decreases. Moreover, an inverse bias voltage impressed to pn junction formed between the drain and substrate of third and fourth n-channel type MOS transistors (32, 42) is able to decrease. Moreover, a faster circuit operation is expected because a substrate bias effect of third and fourth n-channel type MOS transistors (32, 42) does not influence the operation of the circuit.

Moreover, each p-channel type MOS transistor and each n-channel type MOS transistor can be formed on an active region isolated by an insulating film. According to the above structure, an effect is obtained that passing current is small and a fast output circuit is realized.

Moreover, a first signal is a signal having an amplitude between the high voltage and the low voltage, and the first signal is output independently of the output signal. According to the above structure, operation can be fast and drop of load drivability can be restrained. Moreover, a range of adaptation of a level transforming circuit becomes wide.

Moreover, according to the other aspect of present invention, in a semiconductor circuit comprising a low voltage system circuit which is connected between the low voltage electricity source and the ground and which outputs a signal having an amplitude between the low voltage and the ground voltage, and a level transforming circuit transforming a signal output from the low voltage system circuit into a signal having an amplitude between the high voltage higher than the low voltage and the ground voltage, the level transforming circuit being formed according to each of the above first to third aspect.

Incidentally, in the above description, elements designated with symbols in parentheses are for ease of understanding of invention, and these symbols do not limit the scope of present invention.

BRIEF DESCRIPTION OF THE DRAWINGS

The present invention will be understood more fully by the following detailed description in conjunction with the following accompanying drawings.

FIG. 1 is a circuit diagram showing a level transforming circuit according to Embodiment 1 and 2.

DESCRIPTION OF THE PREFERRED EMBODIMENTS

Figure 2A:
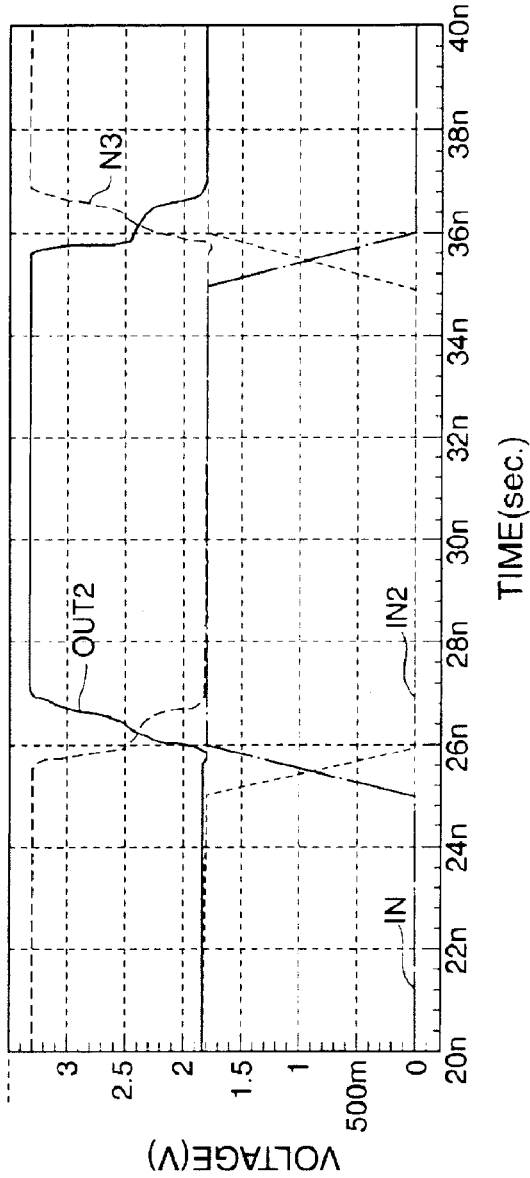
FIG. 2 is a graph showing operation wave form of the level transforming circuit, where (a) corresponds to the level transforming circuit of FIG. 1, and (b) corresponds to the level transforming circuit of FIG. 11.

The preferred embodiments will be described with reference to the accompanying drawings hereafter. Incidentally, in this application and accompanying drawings, as for plural elements having the same function and structure in substance, the same elements are designated with the same symbols, so as to omit the same description.

Embodiment 1

FIG. 1 is a circuit diagram showing a structure of the level transforming circuit according to Embodiment 1.

The level transforming circuit, as shown in FIG. 1, comprises a first CMOS circuit 10, a first intermediate circuit 30, a second intermediate circuit 40, a second CMOS circuit 20, a seventh p-channel type MOS transistor 51p, and an eighth p-channel type MOS transistor 52p.

(The First CMOS Circuit 10)

The first CMOS circuit 10 has PMOS 11, 12 and NMOS 13, 14. PMOS 11, 12 are connected in series, and this series circuit is connected between a high voltage electricity source VDD and an output node N1. Here, the high voltage electricity source VDD provides a high voltage of 3.3V for example. NMOS 13, 14 are connected in series, and this series circuit is connected between the output node N1 and the ground. PMOS 11 has its gate connected with a node N4, so as to function as a pull up switch. On the other hand, NMOS 14 has its gate connected with an input signal IN, so as to function as a pull down switch. For this purpose, the input signal IN has an amplitude between a low voltage VCC and the ground. This low voltage VCC is 1.8V for example which is lower than the high voltage VDD. On the other hand, PMOS 12 and NMOS 13 have their gates impressed with the low voltage VCC in common.

(The First Intermediate Circuit 30)

The first intermediate circuit 30 has PMOS 31 and NMOS 32. PMOS 31 is connected between the high voltage VDD and an output node N3, and its gate is connected with the node N4. NMOS 32 is connected between the output node N3 and the low voltage VCC, and its gate is connected with the node N4.

(The Second Intermediate Circuit 40)

The second intermediate circuit 40 has PMOS 41 and NMOS 42. PMOS 41 is connected between the high voltage VDD and the output node N4, and its gate is connected with the node N3. NMOS 32 is connected between the output node N4 and the low voltage VCC, and its gate is connected with the node N3.

(The Second CMOS Circuit 20)

The second CMOS circuit 20 has PMOS 21, 22 and NMOS 23, 24. PMOS 21, 22 are connected in series, and this series circuit is connected between the high voltage electricity source VDD and the output node N2. NMOS 23,24 are connected in series, and this series circuit is connected between the output node N2 and the ground. PMOS 21 has its gate connected with a node N3, so as to function as a pull up switch. On the other hand, NMOS 24 has its gate connected with an input signal IN2, so as to function as a pull down switch. Here, the input signal IN2 is made of an inverse signal of the input signal IN. On the other hand, PMOS 22 and NMOS 23 have their gates impressed with the low voltage VCC in common.

(The Seventh p-channel Type MOS Transistor 51p)

The seventh p-channel type MOS transistor 51p has its gate connected with the node N1 of first CMOS circuit 10, and its source is connected with the node N3. Besides, its drain is connected with the source of PMOS 12 of first CMOS circuit 10.

(The Eighth p-channel Type MOS Transistor 52p)

The eighth p-channel type MOS transistor 52p has its gate connected with the output signal OUT1, and its source is connected with the node N4. Besides, its drain is connected with the source of PMOS 22 of second CMOS circuit 20.

In the configuration mentioned above, the first intermediate circuit 30 and the second intermediate circuit 40 comprise a latch circuit. To this latch circuit, writing of data is performed by way of the seventh p-channel type MOS transistor 51p and the eighth p-channel type MOS transistor 52p. PMOS 12 and NMOS 13 of CMOS circuit 10 are provided so as to act as an overvoltage protector of PMOS 11 and NMOS 14 respectively, and both gates of PMOS 12 and NMOS 13 are impressed with the low voltage electricity source VCC in common. A substrate (N type well region) of PMOS 11 and a substrate of PMOS 12 are connected with the high voltage electricity source VDD in common. A substrate of NMOS 13 and a substrate of NMOS 14 are connected with the ground in common.

Similarly, PMOS 22 and NMOS 23 of CMOS circuit 20 are provided so as to act as an overvoltage protector of PMOS 21 and NMOS 24 respectively, and both gates of PMOS 22 and NMOS 23 are impressed with the low voltage electricity source VCC in common. A substrate (N type well region) of PMOS 21 and a substrate of PMOS 22 are connected with the high voltage electricity source VDD in common. A substrate of NMOS 23 and a substrate of NMOS 24 are connected with the ground in common.

Moreover, a substrate of PMOS 31 of the first intermediate circuit 30 is connected with the high voltage electricity source VDD, and a substrate of NMOS 32 is connected with the ground.

Similarly, a substrate of PMOS 41 of the second intermediate circuit 40 is connected with the high voltage electricity source VDD, and a substrate of NMOS 42 is connected with the ground.

Moreover, substrates of PMOS 51p and PMOS 52p are connected with the high voltage electricity source VDD respectively.

The operating voltage of each PMOS transistor and NMOS transistor mentioned above is limited by a dielectric strength of their gate oxide film within the scope of more than VCC and more than VDD–VCC and less than VDD. In the description mentioned below, it is provided that a relation of VDD>VCC>=VDD–VCC is maintained. Moreover, the inverse bias strength of a pn junction between the diffusing region and substrate of each PMOS transistor and NMOS transistor is set higher than the high voltage VDD.

The configuration of the voltage converting circuit of Embodiment 1 is made as mentioned above.

Next, the operation of the same voltage converting circuit is described below.

Operation of Embodiment 1

NMOS 14 turns on when the input signal IN is the low voltage VCC. In this occasion, the source electric potential of NMOS 13 goes down. Thus, NMOS 13 turns on. Then, the electric potential of output node N1 goes down to the ground level, and if source of PMOS 12 is high voltage level, then PMOS 12 turns on. Then, source electric potential of PMOS 12 goes down. Moreover, PMOS 51p turns on. Then, the electric potential of node N3 goes down. Therefore, PMOS 41, 21 turns on.

On the other hand, NMOS 24 turns off by inverse signal IN2 of the input signal IN. In this occasion, the source electric potential of PMOS 22 goes up by electric current from PMOS 21. Then, PMOS 22 turns on, and the electric potential of output node N2 goes up. Moreover, PMOS 52p goes to off state from on state. Thus, the electric potential of output node N4 goes up. Then, NMOS 32 turns on, and NMOS 42 turns off. Therefore, high voltage level VDD is put out to the output OUT1 and OUT2 respectively. In this state, no direct current pass exists because PMOS 11, 31 and NMOS 42, 24 are in off state. Moreover, the output node N3 becomes low voltage level VCC, and the output node N4 becomes high voltage level VDD.

On the other hand, NMOS 24 turns on by inverse signal IN2 of the input signal IN when the input signal IN goes to the ground level from the low voltage level VCC. In this occasion, the source electric potential of NMOS 23 goes down. Thus, NMOS 23 turns on. Then, the electric potential of output node N2 goes down to the ground level, and PMOS 22 turns on, because source of PMOS 22 is high voltage level. Then, source electric potential of PMOS 22 goes down. Moreover, PMOS 52p turns on. Then, the electric potential of node N4 goes down. Therefore, PMOS 11, 31 turns on.

On the other hand, NMOS 14 turns off by the input signal IN. In this occasion, the source electric potential of PMOS 12 goes up by electric current from PMOS 11. Then, PMOS 12 turns on, and the electric potential of output node N1 goes up. Moreover, PMOS 51p goes to off state from on state. Thus, the electric potential of output node N3 goes up. Then, NMOS 42 turns on, and NMOS 32 turns off. Therefore, ground level (0V) is put out to the output OUT1 and low voltage level VCC is put out to the output OUT2. In this state, no direct current pass exists because PMOS 21, 41 and NMOS 32, 14 are in off state. Moreover, the output node N3 becomes high voltage level VDD, and the output node N4 becomes low voltage level VCC.

Moreover, the first intermediate circuit 30 and the second intermediate circuit 40 comprise a latch circuit. To this latch circuit, data signal is sent by way of the seventh p-channel type MOS transistor 51p and the eighth p-channel type MOS transistor 52p. The latch circuit operates so as to amplify the data signal with the threshold voltage level of the first intermediate circuit 30 and the second intermediate circuit 40 as a central voltage level. Data is written in the latch circuit so as to keep the data in the latch circuit. In the occasion when data is kept in the latch circuit, it operates so as to send out an electric potential by way of the seventh p-channel type MOS transistor 51p and the eighth p-channel type MOS transistor 52p.

In the operation mentioned above, voltage higher than the low voltage level VCC is never impressed between the gate and the source or drain of each MOS transistor. Moreover, between the gate and the substrate, voltage higher than the low voltage level VCC is never impressed, except NMOS 32, 42, and PMOS S51p, 52p. When a channel is formed as MOS transistor is on, the channel is in the same electric potential as the source. Thus, the voltage between the source and the substrate is not impressed to the gate oxide film. Only the voltage between the gate and the source is impressed to the gate oxide film.

On the other hand, when a channel is not formed as MOS transistor is off, total voltage Vgs+Vsb consisting of gate source voltage Vgs and source substrate voltage Vsb is divided between gate oxide film and a depletion layer under the gate. The depletion layer extends as Vsb increases, and the voltage impressed to the gate oxide film does not increase so much. With the reason mentioned above, even if Vsb is impressed, the maximum voltage impressed to the gate oxide film is not different from the conventional art. Thus, reliability of the gate oxide film is never deteriorated.

Figure 2B:
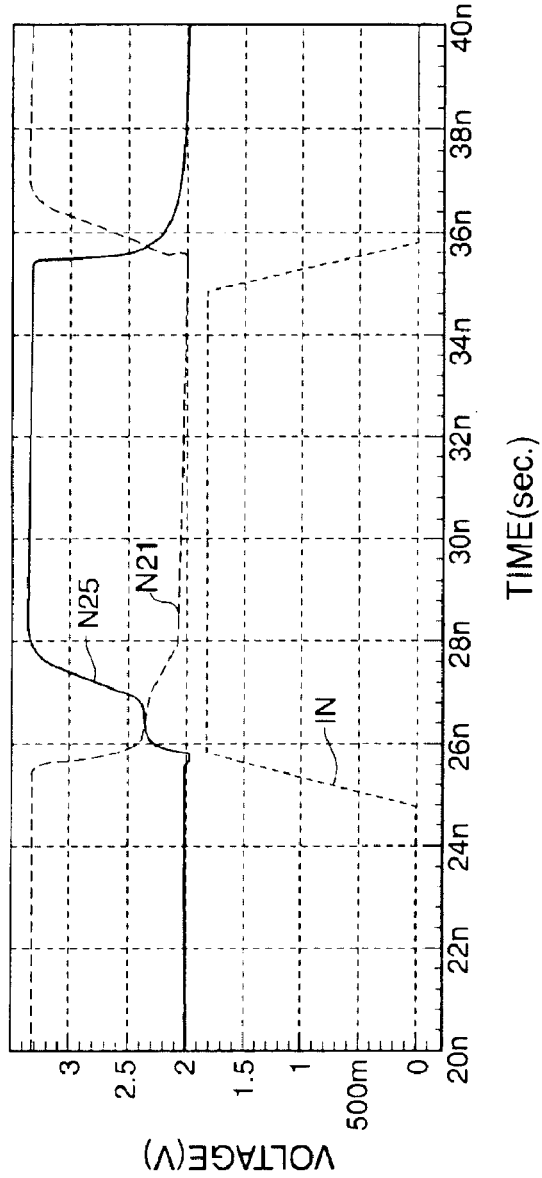
Figure 11:
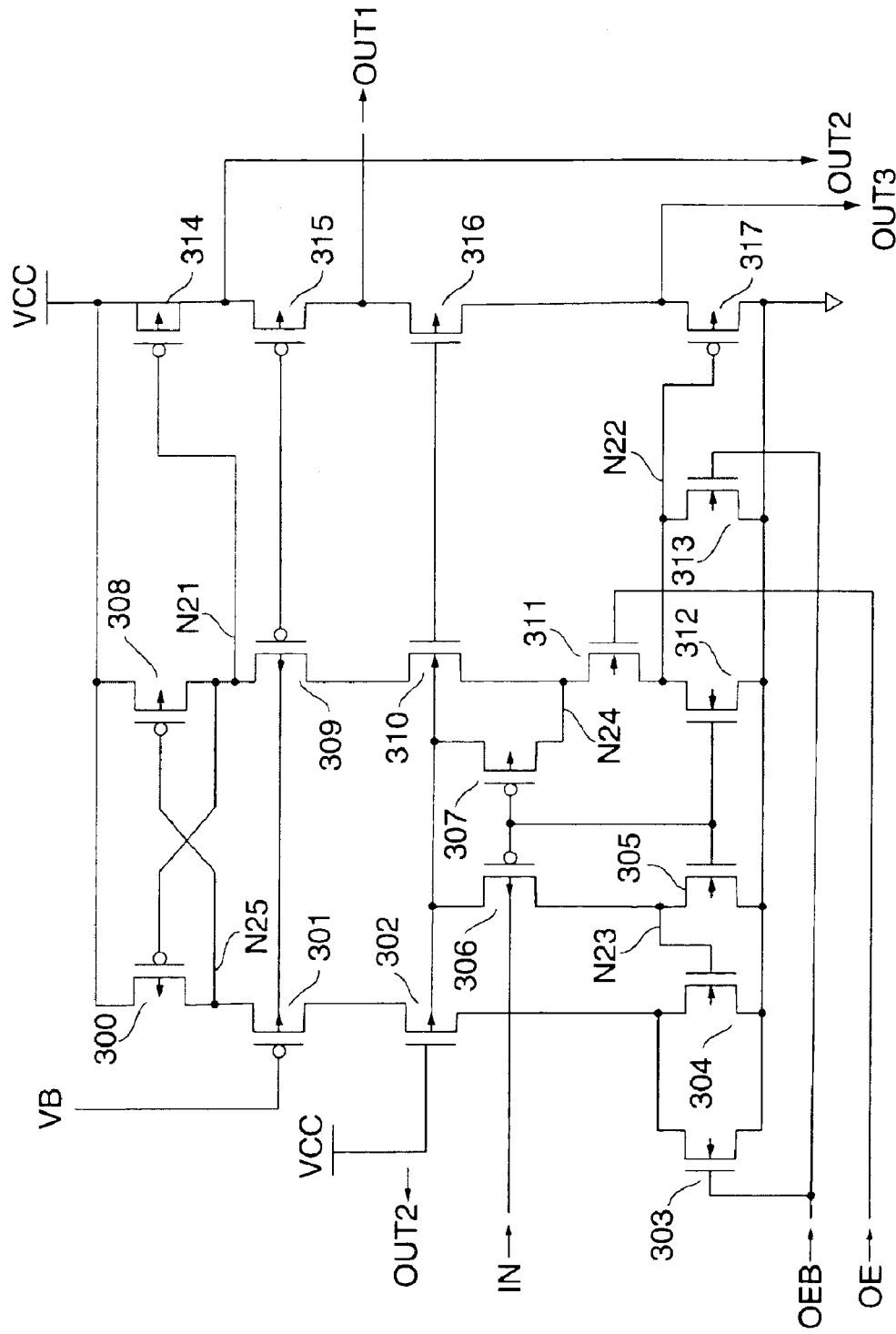
FIG. 11 is a circuit diagram showing a level transforming circuit of the second prior art.
Figure 12:
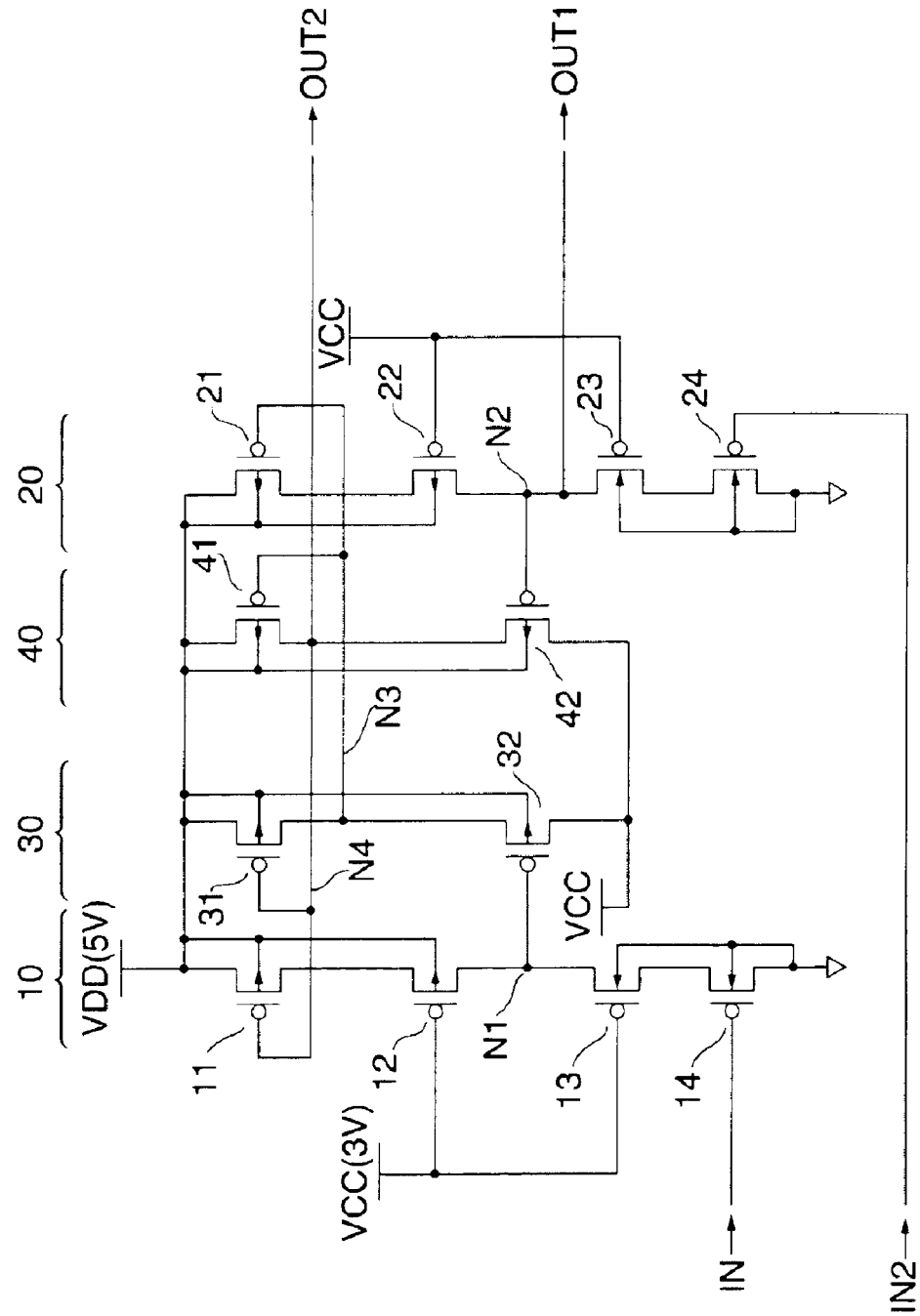
FIG. 12 is a circuit diagram showing a level transforming circuit of the third prior art.

FIGS. 2(a) and 2(b) are graphs of an operation wave of level transforming circuits. FIG. 2(a) is that of present invention and FIG. 2(b) is that of the second conventional art. OUT2, N3 of FIG. 1 correspond to N25, N21 of FIG. 11 respectively. The electric potential Vb of FIG. 11 is set to the low voltage level VCC (=1.8V), so as to make the same condition as FIG. 1. Low level of N25, N21 of FIG. 11 does not decrease to the low voltage level VCC. Instead, they are 2.0V. The falling down wave form of N21 drops sharply to 2.3V, but it descends gently from there, because PMOS becomes off. On the other hand, rising up wave form of N21 goes up more sharply than that of N25 because PMOS 307 turns on and node N24 is charged with electric current from PMOS 304. The sharpness of rising up wave form of N21 is almost the same as that of N3 in FIG. 2(a).

If the low level does not sufficiently drop when PMOS 314 turns on, then the falling down becomes gentle from near 2.3V. Thus, PMOS 314 cannot sufficiently bear the load of output. On the other hand, OUT2 has an amplitude between the high voltage VDD and the low voltage VCC in FIG. 2(a), and the wave form of falling down and rising up becomes gentle for a moment, but it does not matter.

Effect of Embodiment 1

As mentioned above, according to Embodiment 1, the gate oxide film of each transistor mentioned above is not impressed with an electric potential exceeding the low voltage level statically. Therefore, a level transforming circuit can comprise a MOS transistor where an acceptable dielectric strength of the gate insulating film is lower than the high voltage level. The latch circuit comprises a CMOS inverter. Thus, the voltage between the gate and the source impressed with each transistor of the CMOS inverter transiently becomes lower than the low voltage level. Thus, the level transforming circuit of present invention operates faster than the second conventional art (FIG. 11), and a drop of load bearing ability can be restrained.

Moreover, according to Embodiment 1, the level transforming circuit comprises the intermediate circuit consisting of the MOS transistor and the CMOS inverter. Thus, the voltage between the gate and the source impressed with each transistor of the CMOS inverter transiently becomes lower than the low voltage level.

Embodiment 2

Embodiment 2 has almost the same configuration as Embodiment 1 except for the following configuration. The resistance for turning on PMOS 11 of CMOS circuit 10 is set greater than the resistance for turning on PMOS 12, and the resistance for turning on NMOS 14 is set greater than the resistance for turning on NMOS 13. Similarly, the resistance for turning on PMOS 21 of CMOS circuit 20 is set greater than the resistance for turning on PMOS 22, and the resistance for turning on NMOS 24 is set greater than the resistance for turning on NMOS 23. The resistance for turning on PMOS 31 of intermediate circuit inverter 30 is set greater than the resistance for turning on PMOS 51p, and the resistance for turning on PMOS 41 of intermediate circuit inverter 40 is set greater than the resistance for turning on PMOS 52p.

The operation voltage limited by a resisting voltage between the source and the drain of PMOS transistor and NMOS transistor mentioned above is sufficiently higher than voltage (VCC+Vth), and it is sufficiently higher than voltage (VCC−VCC+Vth) and lower than voltage VDD. Here, a maximum of absolute value of the threshold of each MOS transistor is Vth.

Operation of Embodiment 2

To begin with, NMOS 14 turns on when the input signal IN changes from the ground level to the low voltage VCC. In this occasion, the source electric potential of NMOS 13 goes down. Thus, NMOS 13 turns on. Then, the electric potential of output node N1 comes down from the high voltage level. In this occasion, the voltage between the gate and the source of NMOS 13 slightly exceeds the threshold value voltage Vth, because the resistance for turning on NMOS 14 is set greater than the resistance for turning on NMOS 13. The source of PMOS 12 is a high voltage level, and the gate of PMOS 12 is a low voltage level VCC. Thus, PMOS 12 is turned on. Then, the voltage between the drain and the source of PMOS 12 is kept at the low voltage until the electric potential of output node becomes an extent of the low voltage level VCC. Then, the source electric potential of PMOS 12 goes down. Moreover, PMOS 51p turns on. Then, the electric potential of node N3 goes down.

In this occasion, the voltage impressed between the source and the drain of PMOS 51p becomes low because the resistance for turning on PMOS 31 is set greater than the resistance for turning on PMOS 51p. Moreover, the gate-source voltage and the gate-drain voltage of PMOS 51p are restrained beneath the low voltage level VCC because the voltage between the drain and the source of PMOS 12 is kept low voltage, and PMOS 41, 21 turns on.

On the other hand, NMOS 24 turns off by inverse signal IN2 of the input signal IN. In this occasion, the source electric potential of PMOS 22 goes up by electric current from PMOS 21. Then, PMOS 22 turns on, and the electric potential of output node N2 goes up. In this occasion, NMOS 23 is in on state. Then, the drain-source voltage of NMOS 23 is kept at the low voltage until the electric potential of output node N2 becomes an extent of the low level voltage VCC, and the gate-source voltage of PMOS 22 at that time, is an extent slightly exceeding the threshold value of PMOS 22 because the resistance of turning on PMOS 21 is set greater than the resistance of turning on PMOS 22. Moreover, PMOS 52p goes to off state from on state.

In this occasion, the voltage impressed between the source and the drain is low because the resistance of turning on PMOS 41 is set greater than the resistance of turning on PMOS 52p. Moreover, the gate-source voltage and the gate-drain voltage of PMOS 52p are restrained beneath the low voltage level VCC because the drain-source voltage of PMOS 22 is kept at a certain low voltage, and the electric potential of output node N4 goes up. Then, NMOS 32 turns on, and NMOS 42 turns off. Therefore, high voltage level VDD is put out to the output OUT1 and OUT2 respectively.

On the other hand, the same operation is performed when the input signal IN goes to the ground level from the low voltage level VCC. Thus, the same description is omitted.

As described above, a voltage slightly exceeding voltage (VCC+Vthn), even in a transient state, is impressed between the source and the drain of NMOS 13, 23. Here, Vthn is maximum value of the threshold value voltage, and a voltage slightly exceeding voltage (VDD−VCC+Vthn) is impressed between the source and the drain of PMOS 12, 22. Here, Vthp is maximum value of the absolute value of threshold value voltage.

Effect of Embodiment 2

As described above, according to Embodiment 2, voltage exceeding the strength between the source and the drain is never impressed between the source and the drain of each transistor mentioned above, even in a transient state. Therefore, the level transforming circuit can comprise only a MOS transistor whose source-drain strength is lower than the high voltage electricity source. Moreover, a voltage exceeding the low voltage level is never impressed with the gate oxide film of each transistor mentioned above, even in transient state. Therefore, a reliable level transforming circuit can comprise only the MOS transistor whose strength of gate oxide film is lower than the high voltage electricity source level.

Embodiment 3

Figure 3:
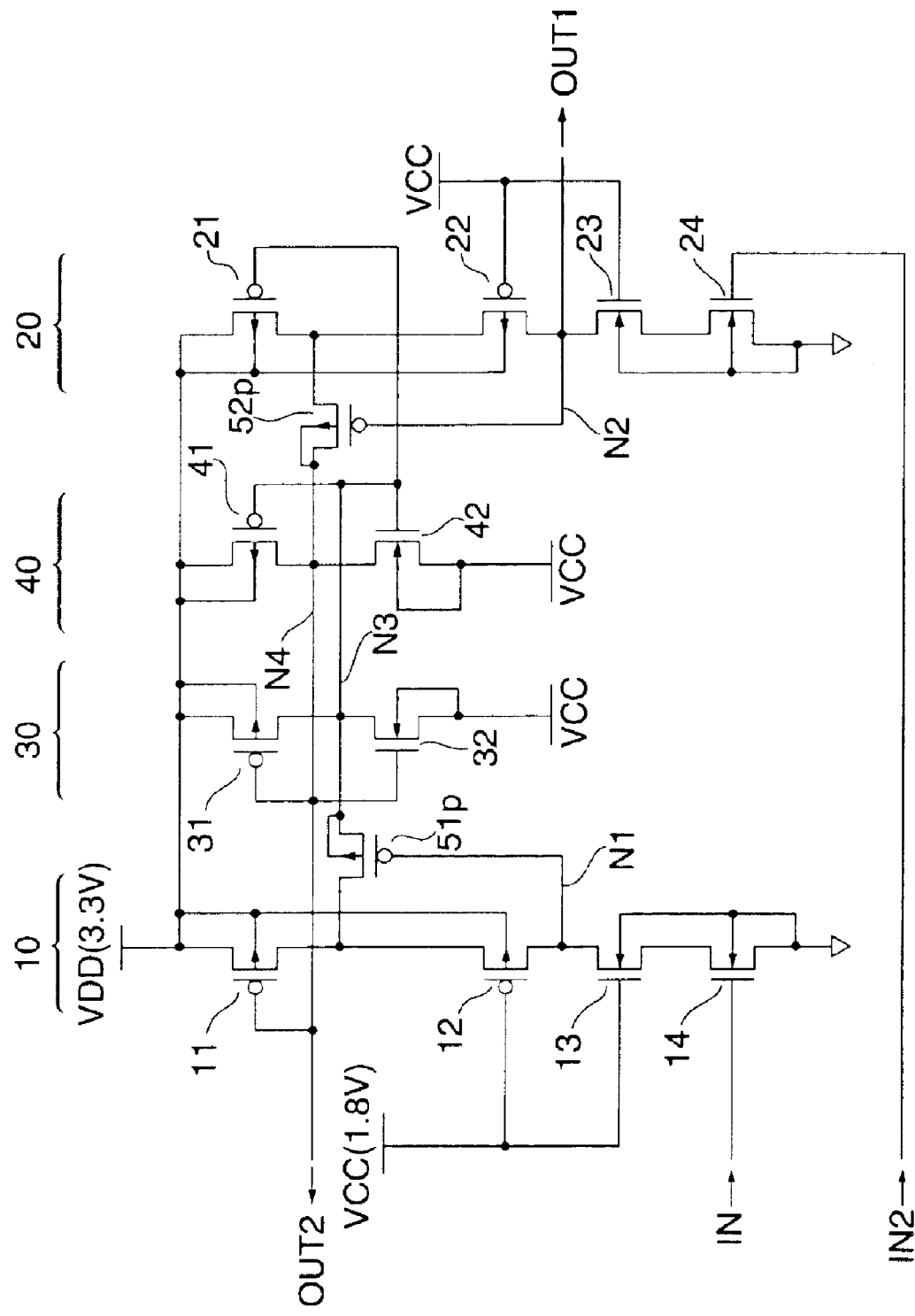
FIG. 3 is a circuit diagram showing a level transforming circuit according to Embodiment 3.

FIG. 3 shows a level transforming circuit according to Embodiment 3. In FIG. 3, elements that are the same as Embodiment 1 are designated with the same symbols.

Embodiment 3 is different from Embodiment 1 or 2 in the following points. As for NMOS 32 of intermediate circuit inverter 30 and NMOS 42 of intermediate circuit inverter 40, their substrates are connected with the sources of each NMOS respectively instead of the ground. As for PMOS 51p, its substrate is connected with the output node N3 instead of the high voltage electricity source VDD. As for PMOS 52p, its substrate is connected with the output node N4 instead of the high voltage electricity source VDD. NMOS 32 and 42 mentioned above are formed in a P well region, which is formed in a deep N well region formed on a p type semiconductor substrate. Thus, these NMOS transistors are electrically separated from the semiconductor substrate.

Operation of Embodiment 3

The operation of this circuit is the same as Embodiment 1 and 2 mentioned above. In Embodiment 1 mentioned above, it is described that voltage impressed with the gate oxide film is an extent of the low voltage level VCC even when the gate-substrate voltage is the high voltage level VCC.

Effect of Embodiment 3

In Embodiment 3, NMOS 32 and 42 are formed in a P well region electrically separated from the semiconductor substrate, and PMOS 51p and 52p are separated from the N well of other PMOS. Substrates of NMOS 32, 42 and PMOS 51p, 52p are connected with their own sources respectively. Therefore, an effect is obtained of further relieving load to the gate oxide film of NMOS 32, 42 and PMOS 51p, 52p. Moreover, inverse bias voltage impressed with the pn junction is relieved, which is formed by the drain and the substrate of NMOS 32 and 42. Moreover, faster operation of the circuit is expected because influence of substrate bias on the operation of circuit does not exist about NMOS 32 and 42.

An element isolation technique such as triple well structure applied to Embodiment 3 has been adopted for LSI made by a fine process for the purpose of reducing substrate noise or reducing leak current, and the cost of production increases by several percent. But, this technique is necessarily adopted from now on, as fineness of elements proceeds. That is, this technique is not adopted only for making the structure of Embodiment 3. Thus, what makes the process of production complicated is not Embodiment 3.

Embodiment 4

Figure 4:
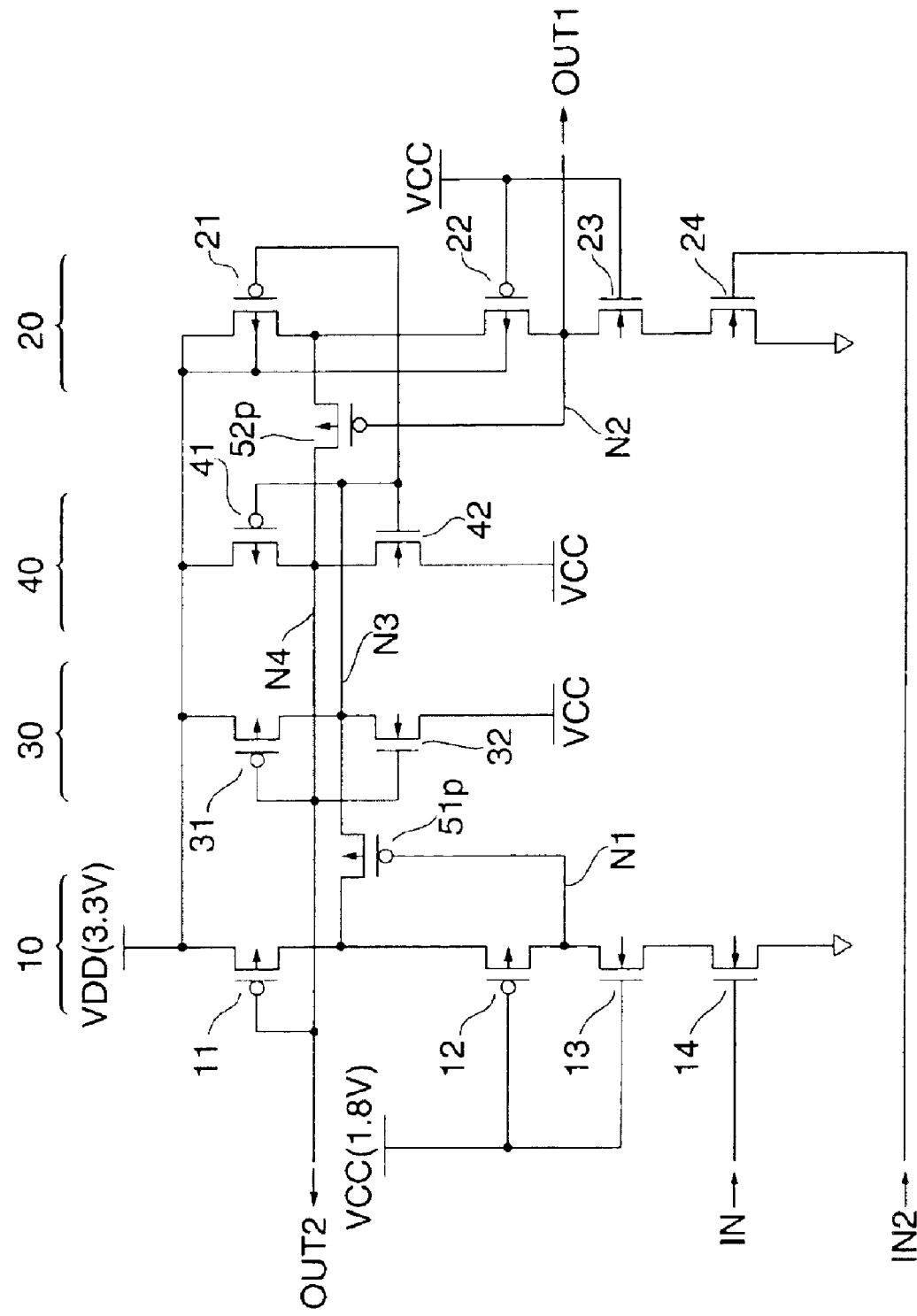
FIG. 4 is a circuit diagram showing a level transforming circuit according to Embodiment 4.

FIG. 4 is a circuit diagram showing the structure of a level transforming circuit according to Embodiment 4. In FIG. 4, the same elements as those in FIG. 1 are designated with the same symbols.

Embodiment 4 comprises each MOS transistor of Embodiment 1, 2 or 3 formed in a silicon region isolated completely by an oxide film. That is, each MOS transistor comprises a transistor of SOI (Silicon On Insulator) structure. The well region (substrate) of bulk CMOS in FIG. 1 is called a body region in SOI structure. As for SOI of a complete depletion type, the body is usually set in floating state, and a transistor having three terminal is obtained. Moreover, as for SOI of a partial depletion type, there is an occasion when the body is set in a floating state, and there is the other occasion when the body is connected with the source or with an electricity source level as the same as bulk CMOS. The configuration of Embodiment 1 is the same as the configuration of Embodiment 3 shown in FIG. 3, in the occasion when the body is connected with the source or with the electricity source level as the same as bulk CMOS. FIG. 4 shows the occasion when the body is set in a floating state.

Operation of Embodiment 4

The operation of the circuit of Embodiment 4 is the same as that of Embodiment 1 or 2 mentioned above.

In the description of Embodiment 1 mentioned above, the inverse bias strength of the pn junction between the diffusing region and the substrate, comprising each PMOS transistor and each NMOS transistor of bulk CMOS, is set higher than high voltage level VDD was described. On the wafer of SOI structure, formed is a berried oxide film, whose thickness is an extent of 100 nm to 500 nm in the silicon layer beneath the surface of the wafer. The region where each transistor is formed is isolated from each other by an oxide film of similar size. Therefore, the strength of the isolating oxide film, which corresponds to the inverse bias strength of the pn junction between the diffusing region and the substrate forming each PMOS transistor and each NMOS transistor of bulk CMOS is set as strong as 10V or higher.

Effect of Embodiment 4

In Embodiment 4, a MOS transistor of SOI structure is adopted. Therefore, the body is able to be used in a floating state. Thus, the manufacturer does not need to care for the voltage between the gate and the body (substrate) of each MOS transistor, and the strength between the drain and the substrate. Moreover, as mentioned above, the strength between the body and the substrate is sufficiently strong as compared with the high voltage level VDD. Therefore, in the latest process of manufacturing a fine structure of a semiconductor, a semiconductor integrated circuit with higher reliability is manufactured.

Moreover, an element region is completely isolated by the oxide film. Therefore, parasitic capacity of the source and the drain of each MOS transistor decreases, and a faster operation of the circuit can be obtained. Further, element isolation of SOI structure adopted in Embodiment 4 is beneficial for decreasing noise in the substrate or decreasing leak current in the junction.

Embodiment 5

Figure 5:
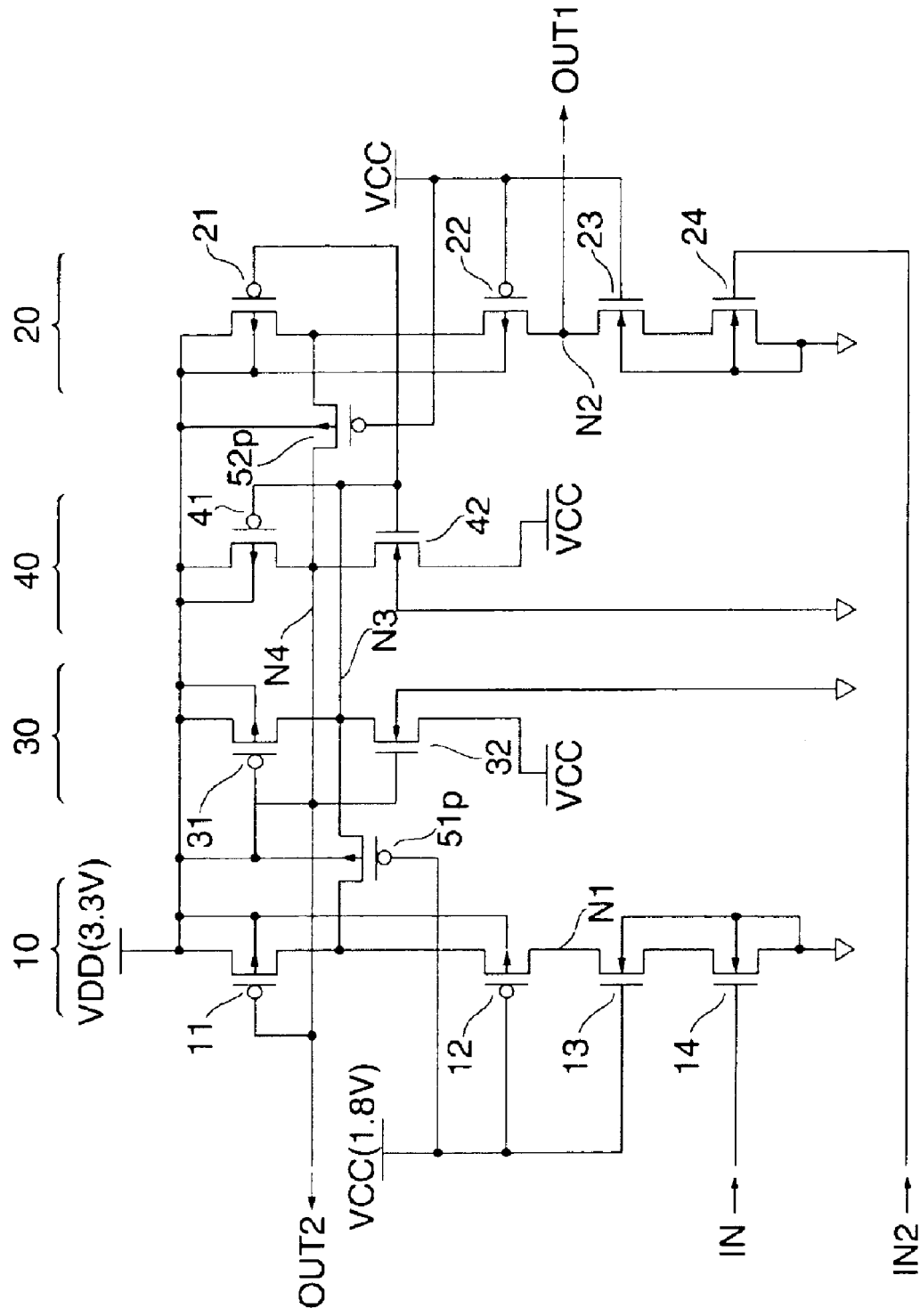
FIG. 5 is a circuit diagram showing a level transforming circuit according to Embodiment 5.

FIG. 5 is a circuit diagram showing the structure of a level transforming circuit according to Embodiment 5. In FIG. 5, the elements that are the same as FIG. 1 are designated with the same symbols.

Embodiment 5 is different from Embodiment 1 in the following points. The gate of PMOS 51p is connected with the low voltage electricity source instead of the output node N1, and the gate of PMOS 52p is connected with the low voltage electricity source instead of the output node N2.

Operation of Embodiment 5

NMOS 14 turns on when the input signal IN is the low voltage VCC. In this occasion, the source electric potential of NMOS 13 goes down. Thus, NMOS 13 turns on. Then, the electric potential of output node N1 goes down to the ground level, and if the source of PMOS 12 is a high voltage level, then PMOS 12 turns on. Then, source electric potential of PMOS 12 goes down. Moreover, PMOS 51p has turned on. Then, the electric potential of node N3 goes down. Therefore, PMOS 41, 21 turns on.

On the other hand, NMOS 24 turns off by inverse signal IN2 of the input signal IN. In this occasion, the source electric potential of PMOS 22 goes up by an electric current from PMOS 21. Then, PMOS 22 turns on, and the electric potential of output node N2 goes up. Moreover, PMOS 52p goes to on state from off state. Thus, the electric potential of output node N4 goes up. Then, NMOS 32 turns on, and NMOS 42 turns off. Therefore, high voltage level VDD is put out to the output OUT1 and OUT2 respectively. In this state, no direct current pass exists because PMOS 11, 31 and NMOS 42, 24 are in off state. Moreover, the output node N3 becomes low voltage level VCC, and the output node N4 becomes high voltage level VDD.

On the other hand, NMOS 24 turns on by inverse signal IN2 of the input signal IN when the input signal IN goes to the ground level from the low voltage level VCC. In this occasion, the source electric potential of NMOS 23 goes down. Thus, NMOS 23 turns on. Then, the electric potential of output node N2 goes down to the ground level, and PMOS 22 turns on because the source of PMOS 22 is the high voltage level. Then, the source electric potential of PMOS 22 goes down. Moreover, PMOS 52p has turned on. Thus, the electric potential of node N4 goes down. Therefore, PMOS 11, 31 turns on.

On the other hand, NMOS 14 turns off by the input signal IN. In this occasion, the source electric potential of PMOS 12 goes up by the electric current from PMOS 11. Then, PMOS 12 turns on, and the electric potential of output node N1 goes up. Moreover, PMOS 51p goes to on state from off state. Thus, the electric potential of output node N3 goes up. Then, NMOS 42 turns on, and NMOS 32 turns off. Therefore, ground level (0V) is put out to the output OUT1 and low voltage level VCC is put out to the output OUT2. In this state, no direct current pass exists because PMOS 21, 41 and NMOS 32, 14 are in off state. Moreover, the output node N3 becomes high voltage level VDD, and the output node N4 becomes low voltage level VCC.

In the operation mentioned above, each MOS transistor is impressed with the same voltage as Embodiment 1 except PMOS S51p, 52p. Since gate electric potential of PMOS 51p, 52p is connected with the electric potential of the low voltage level, the voltage impressed between the gate and the source or between the gate and the drain is not higher than the low voltage level. Moreover, the voltage impressed between the gate and the substrate is not higher than the low voltage level.

Effect of Embodiment 5

As mentioned above, according to Embodiment 5, the gate electric potential of PMOS 51p, 52p is fixed at the low voltage level VCC. Therefore, voltage exceeding the low voltage level is not impressed, even at transient response. Thus, an effect is obtained of a load to the gate oxide film of PMOS 51p, 52p being reduced.

Embodiment 6

Figure 6:
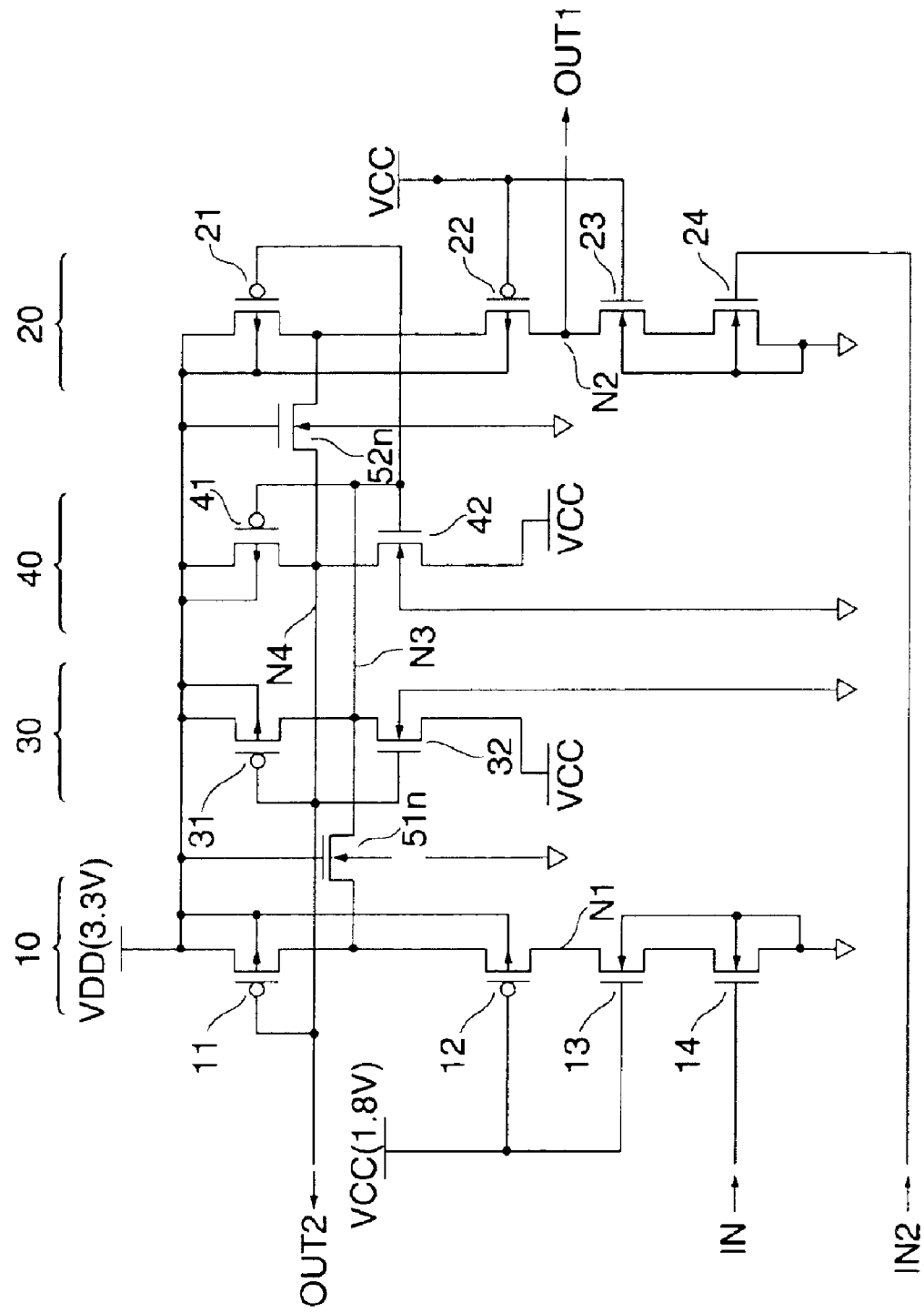
FIG. 6 is a circuit diagram showing a level transforming circuit according to Embodiment 6.

FIG. 6 is a circuit diagram showing the structure of a level transforming circuit according to Embodiment 6. In FIG. 6, the elements that are the same as FIG. 1 are designated with the same symbols.

Embodiment 6 is different from Embodiment 1 in the following points. PMOS 51p is replaced by NMOS 51n. The gate of NMOS 51n is connected with the high voltage electricity source instead of the output node N1. PMOS 52p is replaced by NMOS 52n, and the gate of NMOS 52n is connected with the high voltage electricity source instead of the output node N2.

On the other hand, Embodiment 6 is different from Embodiment 5 in the following points. PMOS 51p is replaced by NMOS 51n. The gate of NMOS 51n is connected with the high voltage electricity source. The substrate of NMOS 51n is connected with the ground level. PMOS 52p is replaced by NMOS 52n. The gate of NMOS 52n is connected with the high voltage electricity source, and the substrate of NMOS 52n is connected with the ground level instead of the high voltage electricity source.

Operation of Embodiment 6

NMOS 14 turns on when the input signal IN is the low voltage VCC. In this occasion, the source electric potential of NMOS 13 goes down. Thus, NMOS 13 turns on. Then, the electric potential of output node N1 goes down to the ground level, and if the source of PMOS 12 is the high voltage level, then PMOS 12 turns on. Then, the source electric potential of PMOS 12 goes down. Moreover, NMOS 51n turns on. Then, the electric potential of node N3 goes down. Therefore, PMOS 41, 21 turns on.

On the other hand, NMOS 24 turns off by inverse signal IN2 of the input signal IN. In this occasion, the source electric potential of PMOS 22 goes up by the electric current from PMOS 21. Then, PMOS 22 turns on, and the electric potential of output node N2 goes up. Moreover, NMOS 52n goes to off state from on state. Thus, the electric potential of output node N4 goes up. Then, NMOS 32 turns on, and NMOS 42 turns off. Therefore, high voltage level VDD is put out to the output OUT1 and OUT2 respectively. In this state, no direct current pass exists because PMOS 11, 31 and NMOS 42, 24 are in off state. Moreover, the output node N3 becomes low voltage level VCC, and the output node N4 becomes high voltage level VDD.

On the other hand, NMOS 24 turns on by inverse signal IN2 of the input signal IN when the input signal IN goes to the ground level from the low voltage level VCC. In this occasion, the source electric potential of NMOS 23 goes down. Thus, NMOS 23 turns on. Then, the electric potential of output node N2 goes down to the ground level, and PMOS 22 turns on because source of PMOS 22 is high voltage level. Then, the source electric potential of PMOS 22 goes down. Moreover, NMOS 52n turns on. Then, the electric potential of node N4 goes down. Therefore, PMOS 11, 31 turns on.

On the other hand, NMOS 14 turns off by the input signal IN. In this occasion, the source electric potential of PMOS 12 goes up by the electric current from PMOS 11. Then, PMOS 12 turns on, and the electric potential of output node N1 goes up. Moreover, NMOS 51n goes to off state from on state. Thus, the electric potential of output node N3 goes up. Then, NMOS 42 turns on, and NMOS 32 turns off. Therefore, ground level (0V) is put out to the output OUT1 and low voltage level VCC is put out to the output OUT2. In this state, no direct current pass exists because PMOS 21, 41 and NMOS 32, 14 are in off state. Moreover, the output node N3 becomes high voltage level VDD, and the output node N4 becomes low voltage level VCC.

In the operation mentioned above, the voltage impressed with each MOS transistor is the same as Embodiment 1, except NMOS 51n, 52n. The gate of NMOS 51n, 52n is connected with the electric potential of the high voltage level, and the electric potential of the source or the drain is between the low voltage level VCC and the high voltage level VDD. Therefore, the voltage impressed between the gate and the source or between the gate and the drain is not higher than the low voltage level. Moreover, the voltage between the gate and the substrate does not matter, as mentioned in Embodiment 1.

Effect of Embodiment 6

As mentioned above, according to Embodiment 6, each gate of NMOS 51n, 52n is connected with the high voltage level VDD. Thus, data is written in a latch circuit comprising intermediate circuit inverter 10 and 20. Therefore, an effect is obtained of reducing the area for elements because the resistance for turning on NMOS is smaller than the resistance for turning on PMOS.

Embodiment 7

Figure 7:
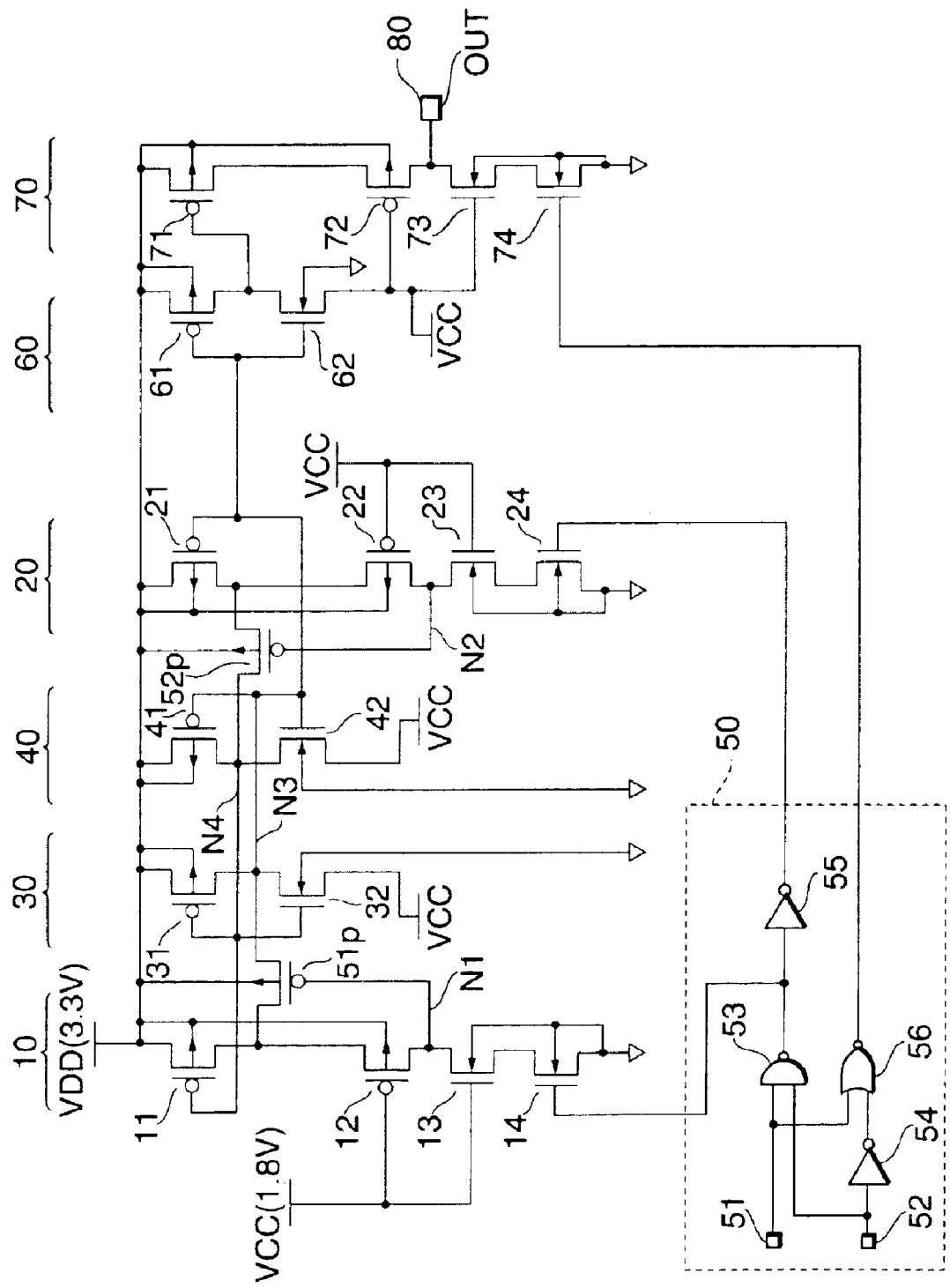
FIG. 7 is a circuit diagram showing a level transforming circuit according to Embodiment 7.

FIG. 7 is a circuit diagram showing Embodiment 7. Embodiment 7 is what applies the level transforming circuit shown in FIG. 1 to an integrated circuit of tri-state buffer. This tri-state buffer comprises a logic circuit 50 which operates by a low voltage electricity source. The output of this logic circuit 50 is connected to the level transforming circuit, which has the structure shown in FIG. 1.

(Logic Circuit 50)

The logic circuit 50 of the low electricity source system has a data terminal 51 and a enable terminal 52, and the circuit comprises a NAND gate 53, inverters 54, 55, and a NOR gate 56. Further, the output of the level transforming circuit is connected with a pre-buffer circuit 60 and a main buffer circuit 70. The pre-buffer circuit 60 comprises PMOS 61 and NMOS 62. It provides PMOS 71 with a signal having an amplitude of a voltage between the high voltage VDD and the low voltage VCC. The main buffer circuit 70 comprises PMOS 71, 72 and NMOS 73, 74, and it puts out the output signal OUT from an output pad 80 to the outside of integrated circuit.

Operation of Embodiment 7

When ground level (0V) is inputted to the enable terminal 52, the high voltage level VDD is impressed to the gate of PMOS 71, and ground level (0V) is impressed to the gate of NMOS 74. Then, output signal OUT gets in a state of high impedance.

On the other hand, when low voltage level VCC is impressed to the enable terminal 52 and to the data terminal 51, the low voltage level VCC is impressed to the gate of PMOS 71, and ground level (0V) is impressed to the gate of NMOS 74. Then, output signal OUT becomes high voltage level VDD.

Moreover, when low voltage level VCC is impressed to the enable terminal 52 and ground level (0V) is impressed to the data terminal 51, the high voltage level VDD is impressed to the gate of PMOS 71, and low voltage level VCC is impressed to the gate of NMOS 74. Then, output signal OUT becomes ground level (0V). Therefore, it functions as a tri-state buffer.

Effect of Embodiment 7

As mentioned above, according to Embodiment 7, a signal having amplitude of voltage ranging from the high voltage level VDD to the low voltage level VCC is provided to PMOS 71, and the pre-buffer circuit 60 drives the main buffer circuit 70 by an inverter operating at a voltage between high voltage level and low voltage level. Therefore, an effect is obtained of realizing an output circuit which passing current is reduced and which operating speed is high.

As mentioned above, preferable Embodiments of the level transforming circuit according to present invention are described. However, the present invention is not limited to these Embodiments. A person of ordinary skill can apparently conceive various modifications or alterations in the scope of technological thought described in the claims. It is naturally understood that such modifications or alterations belong to the technological scope of the present invention.

For example, as for Embodiment 5 mentioned above, described is a structure of connecting each gate of PMOS 51p, 52p with the low voltage level VCC, so as to write data in the latch circuit comprising intermediate circuit inverter 10 and 20. However, if structures described in Embodiment 2 to 4 are applied to Embodiment 5, each effect the same as the effect described in Embodiment 2 to 4 is obtained. Moreover, a structure of MOS diode can be adopted, which connects each gate PMOS 51p, 52p with the corresponding drain.

Figure 8:
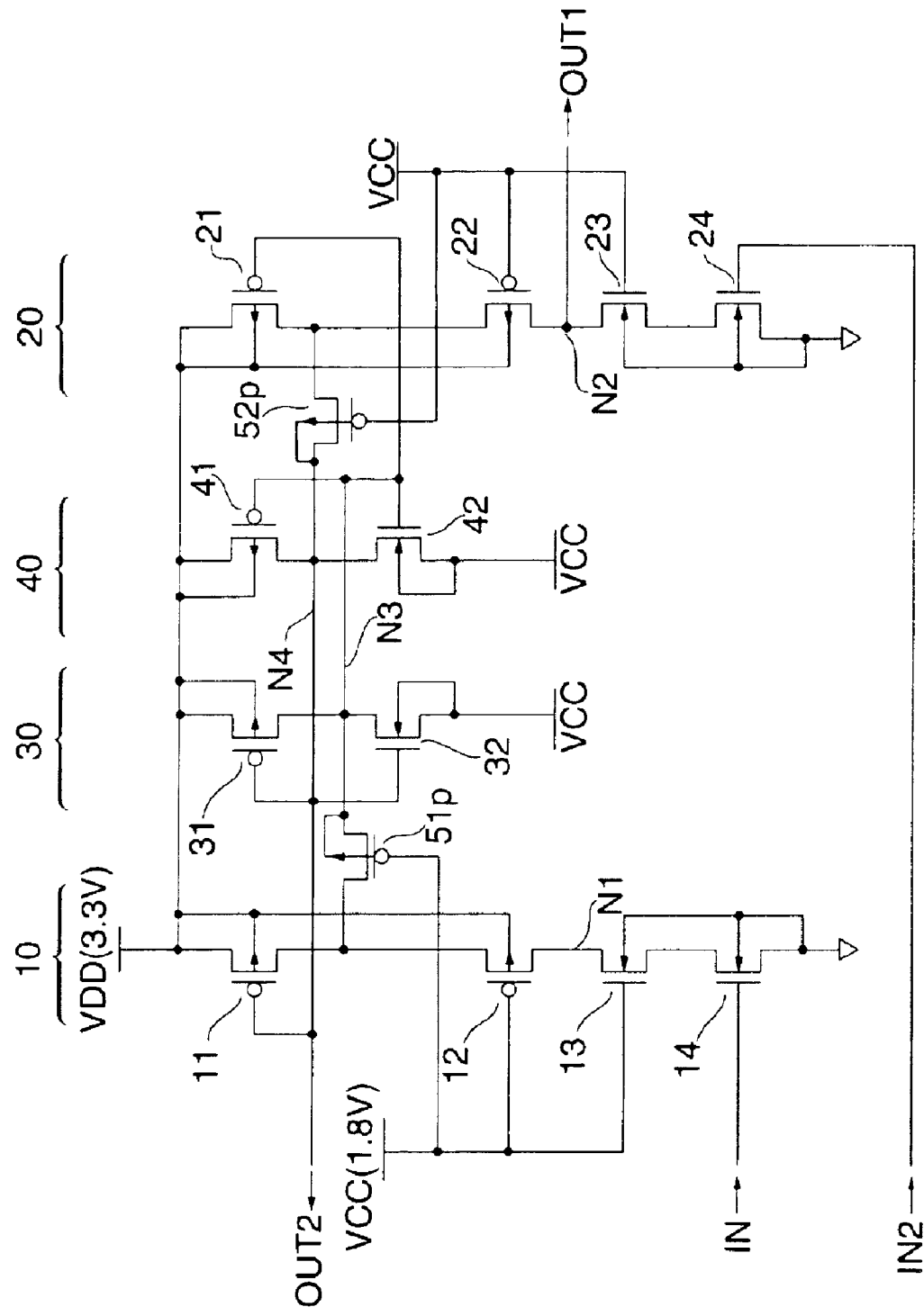
FIG. 8 is a circuit diagram showing a level transforming circuit applying Embodiment 3 to Embodiment 5.
Figure 9:
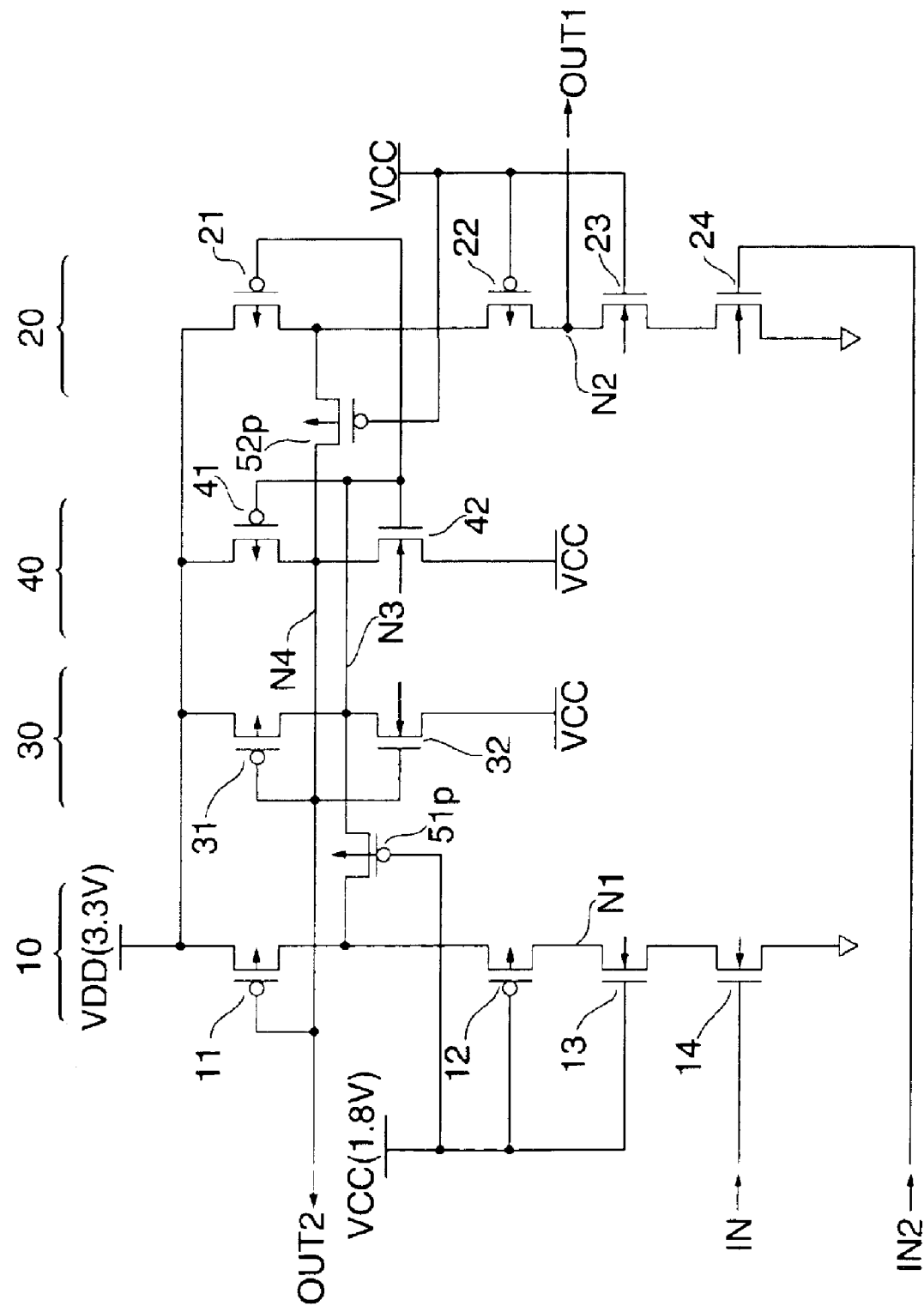
FIG. 9 is a circuit diagram showing a level transforming circuit applying Embodiment 4 to Embodiment 5.
Figure 10:
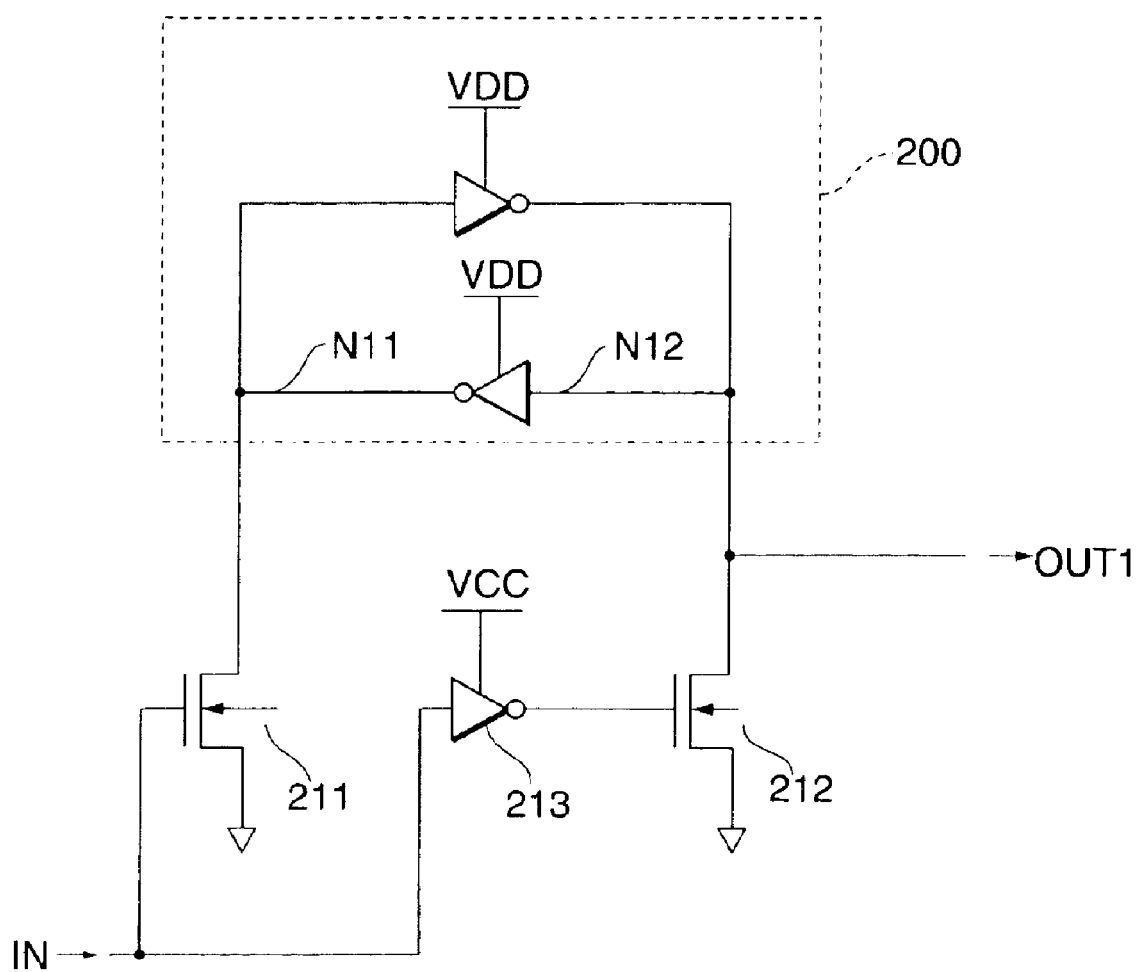
FIG. 10 is a circuit diagram showing a level transforming circuit of the first prior art.

FIG. 8 shows an example which applies the invention of Embodiment 3 to Embodiment 5. FIG. 9 shows an example which applies the invention of Embodiment 4 to Embodiment 5.

Moreover, in Embodiment 6 mentioned above, described is a structure of connecting each gate of NMOS 51n, 52n with the high voltage level VDD, so as to write data in the latch circuit comprising intermediate circuit inverter 10 and 20. However, if structures described in Embodiment 2 to 4 are applied to Embodiment 6, each effect the same as the effect described in Embodiment 2 to 4 is obtained. Moreover, a structure of MOS diode can be adopted, which connects each gate NMOS 51n, 52n with the corresponding drain.

Moreover, the MOS diode of the modification of Embodiment 5 and 6 can be replaced by a pn junction diode.

Moreover, in Embodiment 1, described is the operation by NMOS 14 and 24 functioning for pulling down CMOS circuit 10, 20. However, almost the same operation is performed if input signal IN is directly impressed to the source of NMOS 23, omitting NMOS 24. Similarly, in Embodiment 1, almost the same operation is performed if input signal IN2 is directly impressed to the source of NMOS 13, omitting NMOS 14. Thus, the circuit becomes simpler than Embodiment 1 and only one kind of signal is used. Moreover, similarly, in Embodiment 1, the circuit becomes even simpler, if input signal IN2 is directly impressed to the source of NMOS 13, omitting NMOS 14, besides input signal IN is directly impressed to the source of NMOS 23, omitting NMOS 24.

Moreover, in Embodiment 1, described is the operation by PMOS 11 and 21 functioning for pulling up CMOS circuit 10, 20. However, almost the same operation is performed, even if PMOS 11 and 21 are omitted, and then the circuit becomes simple. Moreover, a similar effect is obtained if PMOS 11 and 21 are omitted about Embodiment 2 to 7 or the modified circuit of Embodiment 1 to 7.

Further, if structures described in Embodiment 1 to 6 are applied to Embodiment 7, the effect the same as each effect described in Embodiment 1 to 6 is obtained.

Moreover, in Embodiment 7, another pre-buffer circuit can be added, or the pre-buffer 60 can be omitted.

Moreover, the low voltage electricity source VCC commonly connected to each MOS transistor 12, 13, 22, 23 etc. is replaced with each individual low electricity source corresponding to each MOS transistor 12, 13, 22, 23 etc. Alternatively, instead, it is replaced with each individual bias circuit. Thus, each resistance of transistor can be adjusted, and it is possible to freely set the gate width or the gate length.

Incidentally, two kinds of electricity sources of 3V and 1.8V are provided in these embodiments. However, in a device of 0.1 $\mu$m age, the strength of the gate oxide film will become an extent of 1.3V. In this occasion, the present invention can be combined by using a combination of high voltage of 1.8V and low voltage of 1.0V.

What is claimed is:

1. A level transforming circuit comprising:

a first CMOS circuit which has first and second p-channel type MOS transistors connected in series between a high voltage electricity source and a first output node, and first and second n-channel type MOS transistors connected in series between said first output node and ground, wherein a gate of said first p-channel type MOS transistor which functions as a pull up switch is impressed with a first signal, wherein a gate of second n-channel type MOS transistor which functions as a pull down switch is impressed with an input signal having an amplitude between a low voltage electricity source and the ground, and wherein gates of said second p-channel type MOS transistor and said first n-channel type MOS transistor are impressed with the low voltage electricity source;

a first intermediate circuit which has a third p-channel type MOS transistor connected between the high voltage electricity source and a second output node, wherein a gate of said third p-channel type MOS transistor is impressed with said first signal, and which has a third n-channel type MOS transistor connected between said second output node and the low voltage electricity source, wherein a gate of said third n-channel type MOS transistor is impressed with said first signal;

a second intermediate circuit which has a fourth p-channel type MOS transistor connected between the high voltage electricity source and a third output node, wherein a gate of said fourth p-channel type MOS transistor is impressed with electric potential of said second output node, and which has a fourth n-channel type MOS transistor connected between the third output node and the low voltage electricity source, wherein a gate of said fourth n-channel type MOS transistor is impressed with the electric potential of said second output node, and which outputs said first signal from said third output node;

a second CMOS circuit which has fifth and sixth p-channel type MOS transistors connected in series between the high voltage electricity source and a fourth output node, and which has fifth and sixth n-channel type MOS transistors connected in series between said fourth output node and the ground, wherein a gate of said fifth p-channel type MOS transistor which functions as a pull up switch is impressed with the electric potential of said second output node, and wherein a gate of said sixth n-channel type MOS transistor which functions as a pull down switch is impressed with an inverse signal of the input signal, and wherein gates of said sixth p-channel type MOS transistor and fifth n-channel type MOS transistor are impressed with the low voltage electricity source and wherein a signal having amplitude of said high voltage and ground voltage is output from said fourth output node;

a seventh p-channel type MOS transistor which is connected between a common node of said first and second p-channel type MOS transistors and said second output node, wherein a gate of said seventh p-channel type MOS transistor is impressed with electric potential of said first output node of said first CMOS circuit;

an eighth p-channel type MOS transistor which is connected between a common node of said fifth and sixth p-channel type MOS transistors and said third output node, wherein a gate of said eighth p-channel type MOS transistor is impressed with electric potential of said fourth output node of said second CMOS circuit.

2. A level transforming circuit according to claim 1, wherein:

a turn-on resistance of said first p-channel type MOS transistor in said first CMOS circuit is higher than a turn-on resistance of said second p-channel type MOS transistor, and a turn-on resistance of said second n-channel type MOS transistor is higher than a turn-on resistance of said first n-channel type MOS transistor;

a turn-on resistance of said fifth p-channel type MOS transistor in said second CMOS circuit is higher than a turn-on resistance of said sixth p-channel type MOS transistor, and a turn-on resistance of said sixth n-channel type MOS transistor is higher than a turn-on resistance of said fifth n-channel type MOS transistor;

a turn-on resistance of said third p-channel type MOS transistor in said first intermediate circuit is higher than a turn-on resistance of said seventh p-channel type MOS transistor; and a turn-on resistance of said fourth p-channel type MOS transistor in said second intermediate circuit is higher than a turn-on resistance of said eighth p-channel type MOS transistor.

3. A level transforming circuit according to claim 1, wherein:

a substrate of said third n-channel type MOS transistor in said first intermediate circuit is connected with a source of said third n-channel type MOS transistor, and a substrate of said fourth n-channel type MOS transistor in said second intermediate circuit is connected with a source of said fourth n-channel type MOS transistor; and said substrate of said third n-channel type MOS transistor and said substrate of said fourth n-channel type MOS transistor are isolated from a substrate of each of said first, second, fifth and sixth n-channel type MOS transistors.

4. A level transforming circuit according to claim 1, wherein:

a substrate of each of said seventh p-channel type MOS transistor and said eighth p-channel type MOS transistor is connected to a respective source of each of said seventh and eighth p-channel type MOS transistors; and said substrate of said seventh p-channel type MOS transistor and said substrate of said eighth p-channel type MOS transistor are isolated from a substrate of each of said first to sixth n-channel type MOS transistors.

5. A level transforming circuit according to claim 1, wherein:

said first to eighth p-channel type MOS transistors and said first to sixth n-channel type MOS transistors are formed on an active region isolated by insulating film.

6. A level transforming circuit according to claim 1, wherein:

said first signal is a signal having an amplitude between the high voltage and the low voltage, and said first signal is output independently of said output signal.

7. A level transforming circuit comprising:

a first CMOS circuit which has first and second p-channel type MOS transistors connected in series between a high voltage electricity source and a first output node, and first and second n-channel type MOS transistors connected in series between said first output node and ground, wherein a gate of said first p-channel type MOS transistor which functions as a pull up switch is impressed with a first signal, wherein a gate of second n-channel type MOS transistor which functions as a pull down switch is impressed with an input signal having an amplitude between a low voltage electricity source and the ground, and wherein gates of said second p-channel type MOS transistor and said first n-channel type MOS transistor are impressed with the low voltage electricity source;

a first intermediate circuit which has a third p-channel type MOS transistor connected between the high voltage electricity source and a second output node, wherein a gate of said third p-channel type MOS transistor is impressed with said first signal, and which has a third n-channel type MOS transistor connected between said second output node and the low voltage electricity source, wherein a gate of said third n-channel type MOS transistor is impressed with said first signal;

a second intermediate circuit which has a fourth p-channel type MOS transistor connected between the high voltage electricity source and a third output node, wherein a gate of said fourth p-channel type MOS transistor is impressed with electric potential of said second output node, and which has a fourth n-channel type MOS transistor connected between the third output node and the low voltage electricity source, wherein a gate of said fourth n-channel type MOS transistor is impressed with the electric potential of said second output node, and which outputs said first signal from said third output node;

a second CMOS circuit which has fifth and sixth p-channel type MOS transistors connected in series between the high voltage electricity source and a fourth output node, and which has fifth and sixth n-channel type MOS transistors connected in series between said fourth output node and the ground, wherein a gate of said fifth p-channel type MOS transistor which functions as a pull up switch is impressed with the electric potential of said second output node, and wherein a gate of said sixth n-channel type MOS transistor which functions as a pull down switch is impressed with an inverse signal of the input signal, and wherein gates of said sixth p-channel type MOS transistor and fifth n-channel type MOS transistor are impressed with the low voltage electricity source, and wherein a signal having amplitude of said high voltage and ground voltage is output from said fourth output node;

a seventh p-channel type MOS transistor which is connected between a common node of said first and second p-channel type MOS transistors and said second output node, wherein a gate of said seventh p-channel type MOS transistor is impressed with electric potential of said low voltage;

an eighth p-channel type MOS transistor which is connected between a common node of said fifth and sixth p-channel type MOS transistors and said third output node, wherein a gate of said eighth p-channel type MOS transistor is impressed with electric potential of said low voltage.

8. A level transforming circuit according to claim 7, wherein:

a turn-on resistance of said first p-channel type MOS transistor in said first CMOS circuit is higher than a turn-on resistance of said second p-channel type MOS transistor, and a turn-on resistance of said second n-channel type MOS transistor is higher than a turn-on resistance of said first n-channel type MOS transistor;

a turn-on resistance of said fifth p-channel type MOS transistor in said second CMOS circuit is higher than a turn-on resistance of said sixth p-channel type MOS transistor, and a turn-on resistance of said sixth n-channel type MOS transistor is higher than a turn-on resistance of said fifth n-channel type MOS transistor;

a turn-on resistance of said third p-channel type MOS transistor in said first intermediate circuit is higher than a turn-on resistance of said seventh p-channel type MOS transistor; and a turn-on resistance of said fourth p-channel type MOS transistor in said second intermediate circuit is higher than a turn-on resistance of said eighth p-channel type MOS transistor.

9. A level transforming circuit according to claim 7, wherein:

a substrate of said third n-channel type MOS transistor in said first intermediate circuit is connected with source of said third n-channel type MOS transistor, and a substrate of said fourth n-channel type MOS transistor in said second intermediate circuit is connected with a source of said fourth n-channel type MOS transistor; and said substrate of said third n-channel type MOS transistor and said substrate of said fourth n-channel type MOS transistor are isolated from a substrate of each of said first, second, fifth and sixth n-channel type MOS transistors.

10. A level transforming circuit according to claim 7, wherein:

a substrate of each of said seventh p-channel type MOS transistor and said eighth p-channel type MOS transistor is connected to a respective source of each of said seventh and eighth p-channel type MOS transistors; and said substrate of said seventh p-channel type MOS transistor and said substrate of said eighth p-channel type MOS transistor are isolated from a substrate of each of said first to sixth n-channel type MOS transistors.

11. A level transforming circuit according to claim 7, wherein:

said first to eighth p-channel type MOS transistors and said first to sixth n-channel type MOS transistors are formed on an active region isolated by insulating film.

12. A level transforming circuit according to claim 7, wherein:

said first signal is a signal having an amplitude between the high voltage and the low voltage, and said first signal is output independently of said output signal.

13. A level transforming circuit comprising:

a first CMOS circuit which has first and second p-channel type MOS transistors connected in series between a high voltage electricity source and a first output node, and first and second n-channel type MOS transistors connected in series between said first output node and ground, wherein a gate of said first p-channel type MOS transistor which functions as a pull up switch is impressed with a first signal, wherein a gate of second n-channel type MOS transistor which functions as a pull down switch is impressed with an input signal having an amplitude between a low voltage electricity source and the ground, and wherein gates of said second p-channel type MOS transistor and said first n-channel type MOS transistor are impressed with the low voltage electricity source;

a first intermediate circuit which has a third p-channel type MOS transistor connected between the high voltage electricity source and second output node, wherein a gate of said third p-channel type MOS transistor is impressed with said first signal, and which has third n-channel type MOS transistor connected between said second output node and the low voltage electricity source, wherein a gate of said third n-channel type MOS transistor is impressed with said first signal;

a second intermediate circuit which has a fourth p-channel type MOS transistor connected between the high voltage electricity source and a third output node, wherein a gate of said fourth p-channel type MOS transistor is impressed with electric potential of second output node of said first intermediate circuit, and which has a fourth n-channel type MOS transistor connected between the third output node and the low voltage electricity source, wherein a gate of said fourth n-channel type MOS transistor is impressed with the electric potential of said second output node, and which outputs said first signal from said third output node;

a second CMOS circuit which has fifth and sixth p-channel type MOS transistors connected in series between the high voltage electricity source and a fourth output node, and which has fifth and sixth n-channel type MOS transistors connected in series between said fourth output node and the ground, wherein a gate of said fifth p-channel type MOS transistor which functions as a pull up switch is impressed with the electric potential of said second output node, and wherein a gate of said sixth n-channel type MOS transistor which functions as a pull down switch is impressed with an inverse signal of the input signal, and wherein gates of said sixth p-channel type MOS transistor and fifth n-channel type MOS transistor are impressed with the low voltage electricity source, and wherein a signal having amplitude of said high voltage and ground voltage is output from said fourth output node;

a seventh n-channel type MOS transistor which is connected between a common node of said first and second p-channel type MOS transistors and said second output node, wherein a gate of said seventh n-channel type MOS transistor is impressed with electric potential of said high voltage;

an eighth n-channel type MOS transistor which is connected between a common node of said fifth and sixth p-channel type MOS transistors and said third output node, wherein a gate of said eighth n-channel type MOS transistor is impressed with electric potential of said high voltage.

14. A level transforming circuit according to claim 13, wherein:

a turn-on resistance of said first p-channel type MOS transistor in said first CMOS circuit is higher than a turn-on resistance of said second p-channel type MOS transistor, and a turn-on resistance of said second n-channel type MOS transistor is higher than a turn-on resistance of said first n-channel type MOS transistor;

a turn-on resistance of said fifth p-channel type MOS transistor in said second CMOS circuit is higher than a turn-on resistance of said sixth p-channel type MOS transistor, and a turn-on resistance of said sixth n-channel type MOS transistor is higher than a turn-on resistance of said fifth n-channel type MOS transistor;

a turn-on resistance of said third p-channel type MOS transistor in said first intermediate circuit is higher than a turn-on resistance of said seventh n-channel type MOS transistor; and a turn-on resistance of said fourth p-channel type MOS transistor in said second intermediate circuit is higher than a turn-on resistance of said eighth n-channel type MOS transistor.

15. A level transforming circuit according to claim 13, wherein:

a substrate of said third n-channel type MOS transistor in said first intermediate circuit is connected with a source of said third n-channel type MOS transistor, and a substrate of said fourth n-channel type MOS transistor in said second intermediate circuit is connected with a source of said fourth n-channel type MOS transistor; and said substrate of said third n-channel type MOS transistor and said substrate of said fourth n-channel type MOS transistor are isolated from a substrate of each of said first, second, fifth and sixth n-channel type MOS transistors.

16. A level transforming circuit according to claim 13, wherein:

said first to sixth p-channel type MOS transistors and said first to eighth n-channel type MOS transistors are formed on an active region isolated by insulating film.

17. A level transforming circuit according to claim 13, wherein:

said first signal having an amplitude between the high voltage and the low voltage, and said first signal output independently of said output signal.

* * * * *